(12) United States Patent
Sun et al.

(10) Patent No.: US 10,771,160 B2
(45) Date of Patent: Sep. 8, 2020

(54) LASER MODULE FOR OPTICAL DATA COMMUNICATION SYSTEM

(71) Applicant: Ayar Labs, Inc., San Francisco, CA (US)

(72) Inventors: Chen Sun, Berkeley, CA (US); Roy Edward Meade, Oakland, CA (US); Mark Wade, Berkeley, CA (US); Alexandra Wright, San Francisco, CA (US); Vladimir Stojanovic, Berkeley, CA (US); Rajeev Ram, San Francisco, CA (US); Milos Popovic, San Francisco, CA (US); Derek Van Orden, San Francisco, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 0 days.

(21) Appl. No.: 15/650,586

(22) Filed: Jul. 14, 2017

(65) Prior Publication Data

US 2018/0019820 A1    Jan. 18, 2018

Related U.S. Application Data

(60) Provisional application No. 62/362,551, filed on Jul. 14, 2016.

(51) Int. Cl.
*G02B 6/12* (2006.01)
*H04B 10/50* (2013.01)
(Continued)

(52) U.S. Cl.
CPC ......... *H04B 10/504* (2013.01); *H01S 5/0268* (2013.01); *H01S 5/02248* (2013.01);
(Continued)

(58) Field of Classification Search
CPC .......... H04B 10/504; H04J 14/02; H01S 4/00; H01S 2302/00
See application file for complete search history.

(56) References Cited

U.S. PATENT DOCUMENTS

| | | |
|---|---|---|
| 5,394,489 A | 2/1995 | Koch |
| 5,557,439 A | 9/1996 | Alexander et al. |

(Continued)

FOREIGN PATENT DOCUMENTS

| | | |
|---|---|---|
| CA | 2361509 A1 | 4/2003 |
| WO | 2014121443 A1 | 8/2014 |

*Primary Examiner* — Ellen E Kim
(74) *Attorney, Agent, or Firm* — Penilla IP, APC

(57) ABSTRACT

A laser module includes a laser source and an optical marshalling module. The laser source is configured to generate and output a plurality of laser beams. The plurality of laser beams have different wavelengths relative to each other. The different wavelengths are distinguishable to an optical data communication system. The optical marshalling module is configured to receive the plurality of laser beams from the laser source and distribute a portion of each of the plurality of laser beams to each of a plurality of optical output ports of the optical marshalling module, such that all of the different wavelengths of the plurality of laser beams are provided to each of the plurality of optical output ports of the optical marshalling module. An optical amplifying module can be included to amplify laser light output from the optical marshalling module and provide the amplified laser light as output from the laser module.

25 Claims, 20 Drawing Sheets

(51) Int. Cl.

| | |
|---|---|
| *H01S 5/40* | (2006.01) |
| *H01S 5/026* | (2006.01) |
| *H01S 5/022* | (2006.01) |
| *H04J 14/02* | (2006.01) |
| *H01S 5/50* | (2006.01) |
| *H01S 5/024* | (2006.01) |
| *H01S 4/00* | (2006.01) |

(52) U.S. Cl.
CPC .......... *H01S 5/4012* (2013.01); *H01S 5/4087* (2013.01); *H04B 10/506* (2013.01); *H04J 14/02* (2013.01); *H04J 14/0256* (2013.01); *H01S 4/00* (2013.01); *H01S 5/02476* (2013.01); *H01S 5/50* (2013.01); *H01S 2302/00* (2013.01)

(56) References Cited

U.S. PATENT DOCUMENTS

| | | | |
|---|---|---|---|
| 9,372,306 B1 * | 6/2016 | Nagarajan | G02B 6/12004 |
| 9,438,970 B2 * | 9/2016 | Jones | G02B 6/12019 |
| 2003/0095737 A1 * | 5/2003 | Welch | B82Y 20/00 |
| | | | 385/14 |
| 2006/0165373 A1 | 7/2006 | Blauvelt et al. | |
| 2011/0293279 A1 * | 12/2011 | Lam | H04J 14/02 |
| | | | 398/79 |
| 2013/0223844 A1 * | 8/2013 | Hwang | H04B 10/572 |
| | | | 398/91 |
| 2014/0328591 A1 | 11/2014 | Koch et al. | |
| 2015/0050020 A1 | 2/2015 | Tanaka | |

* cited by examiner

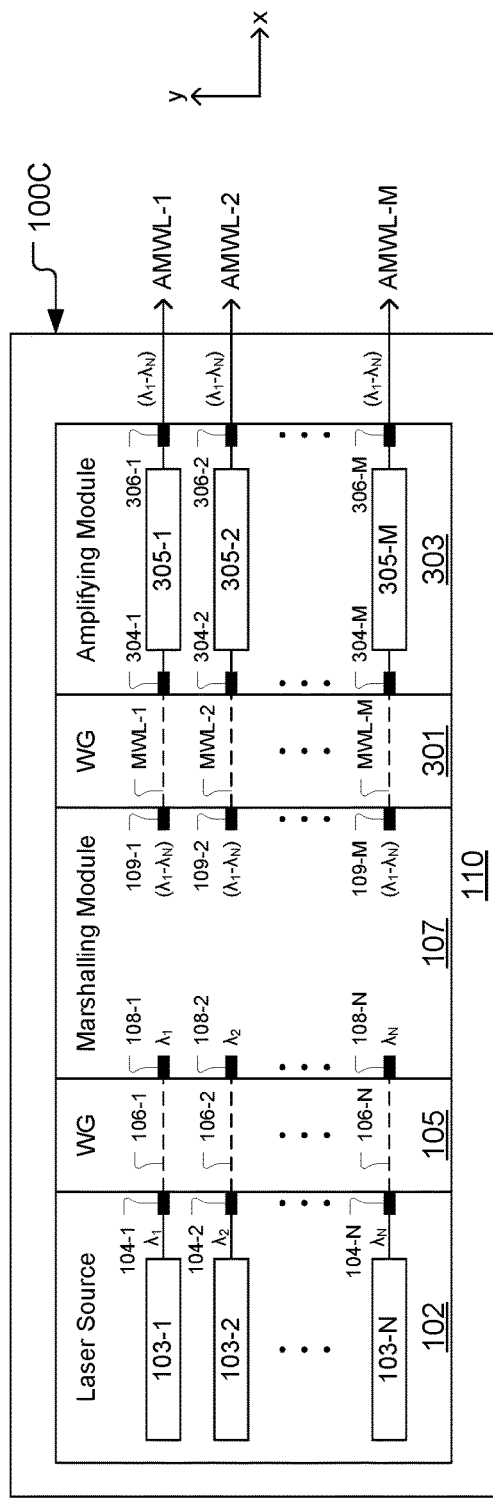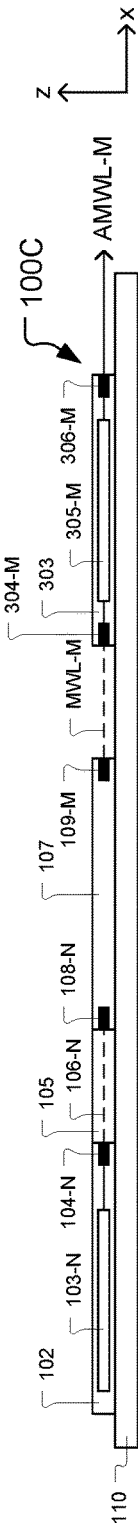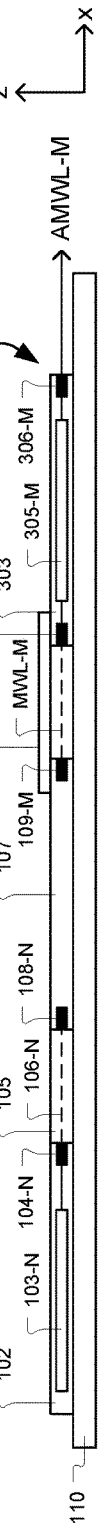
Fig. 3A
Fig. 3B
Fig. 3C
Fig. 3D

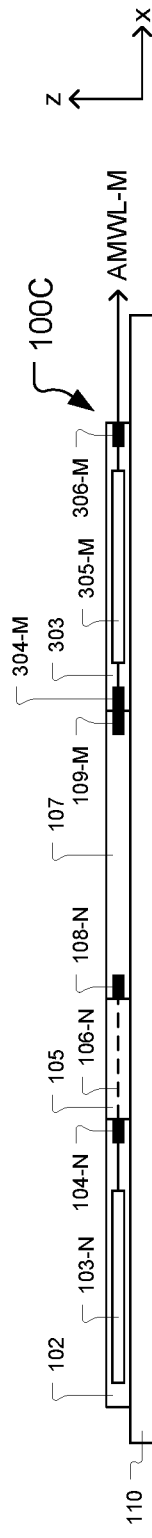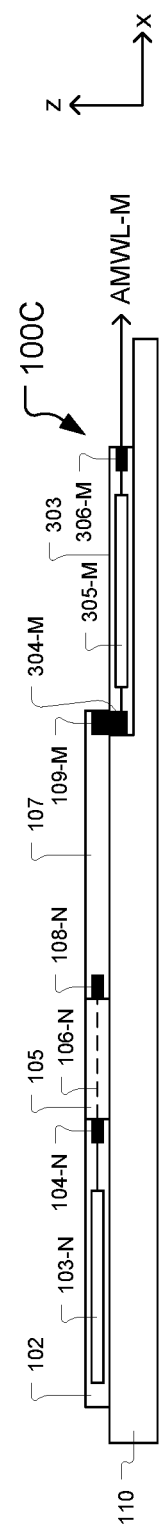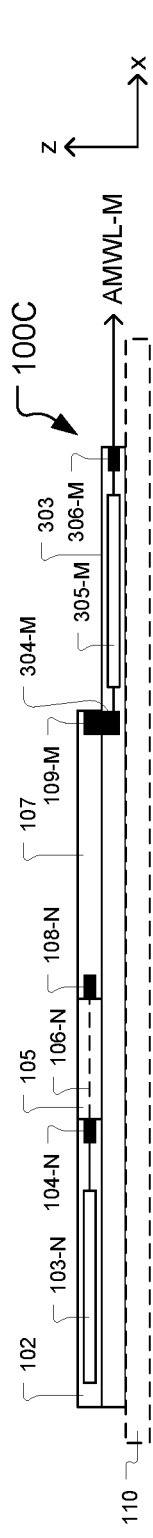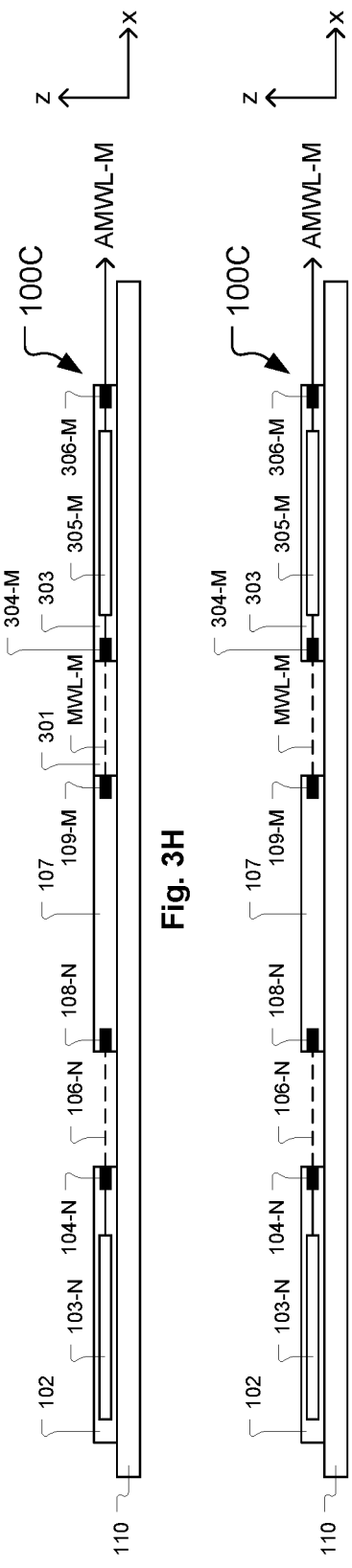

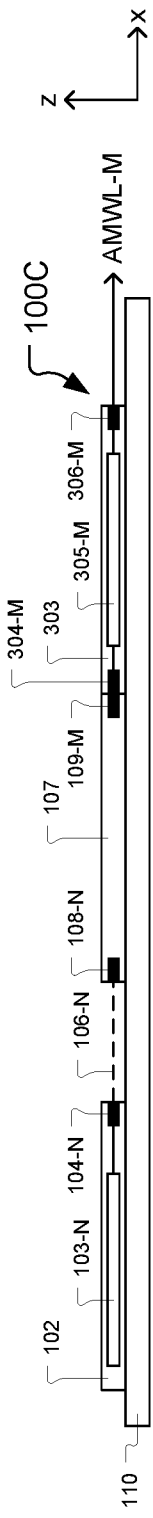
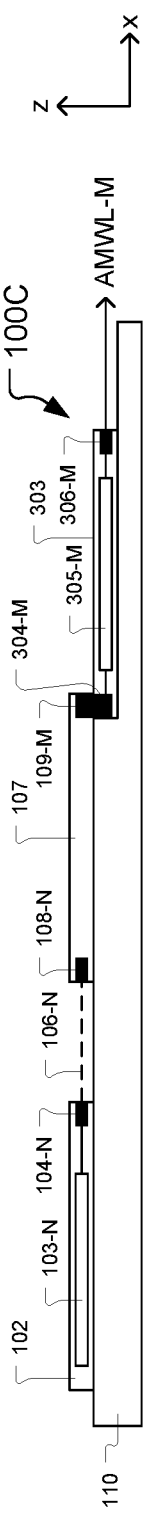
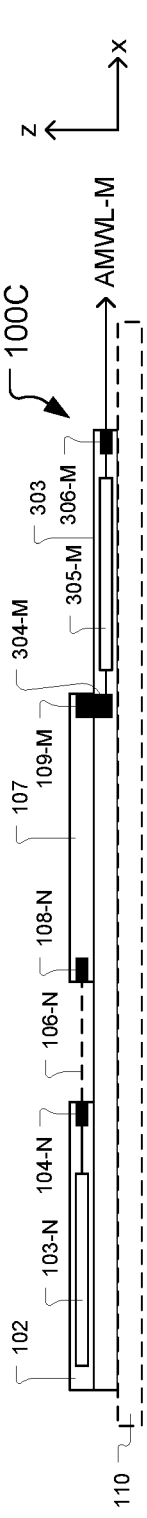
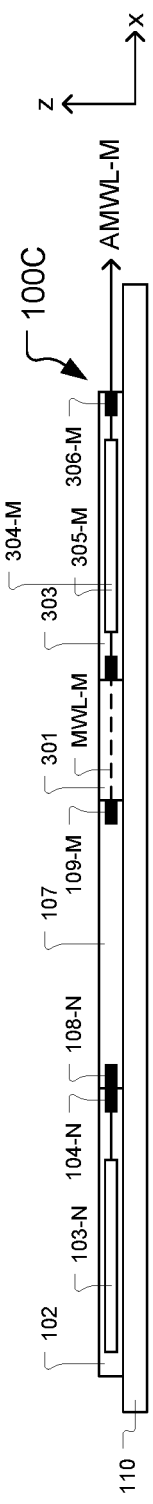
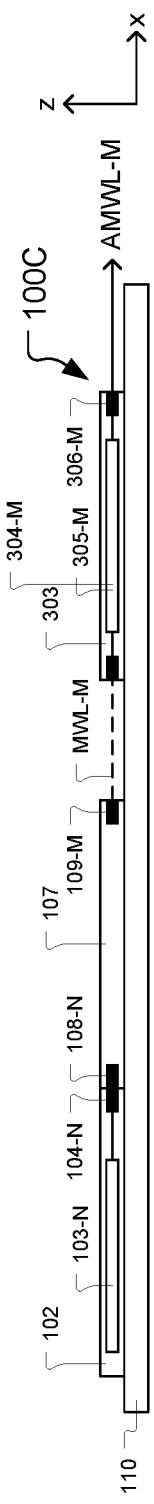

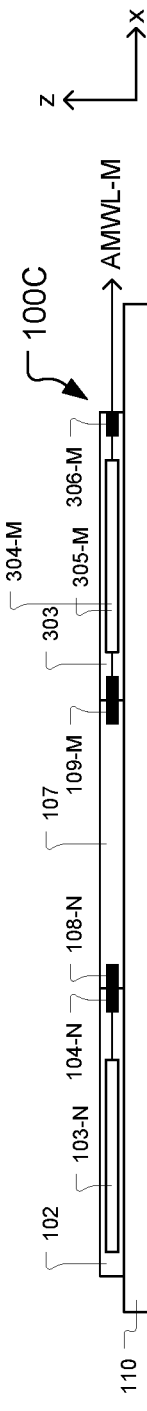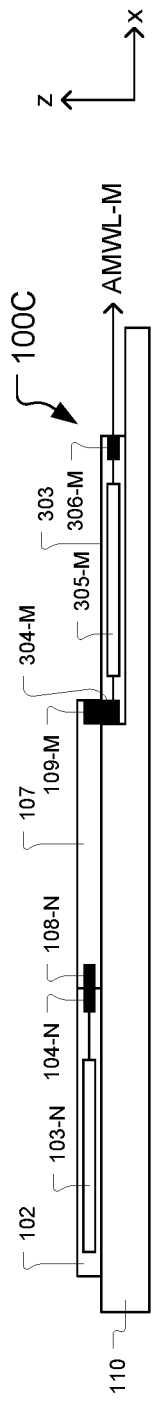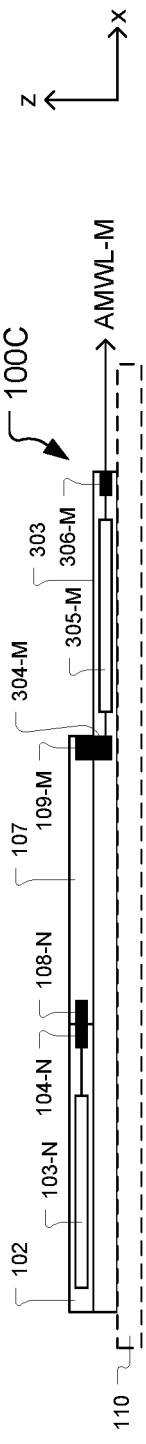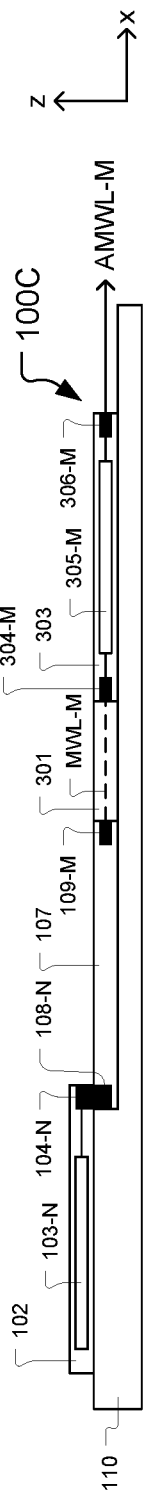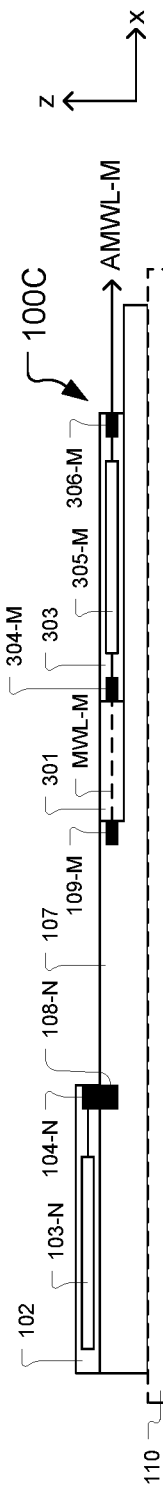

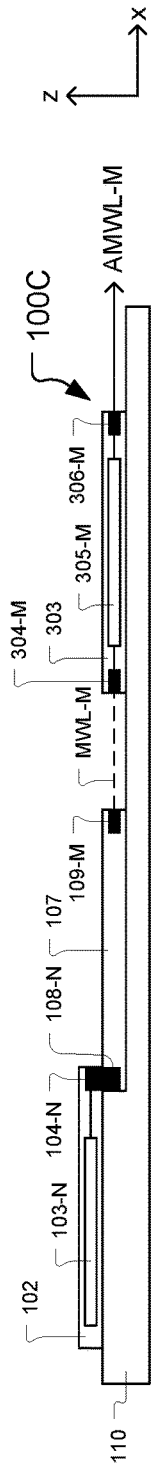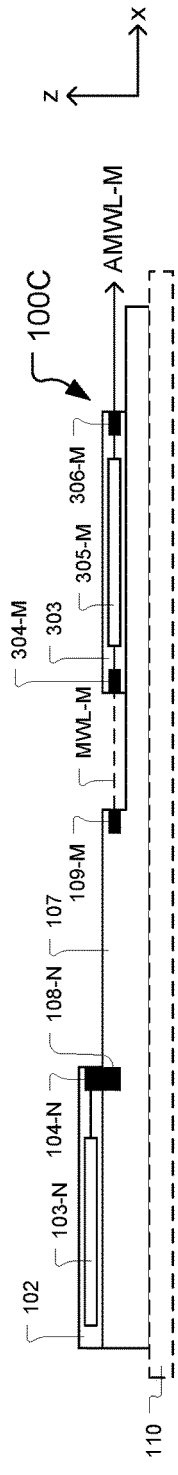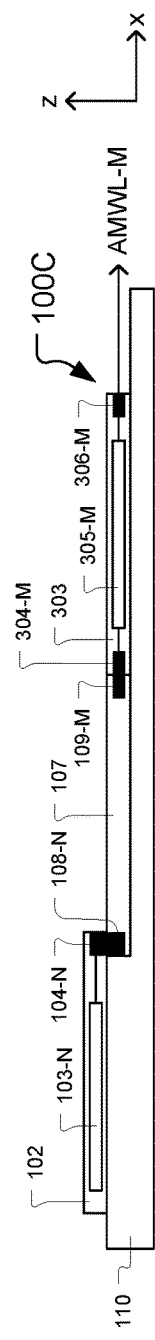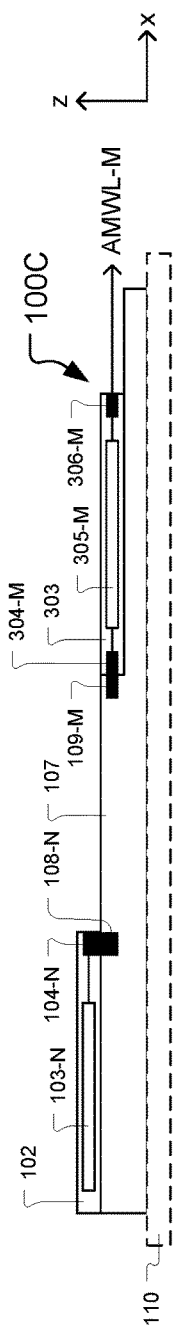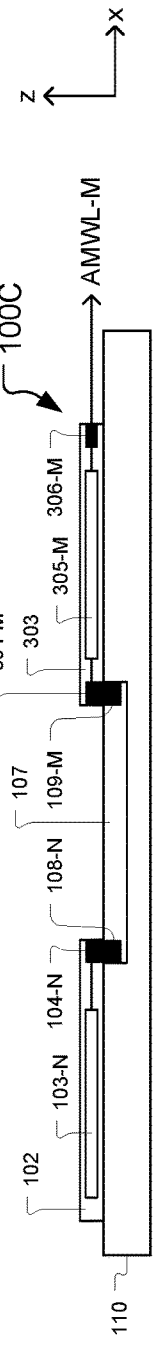

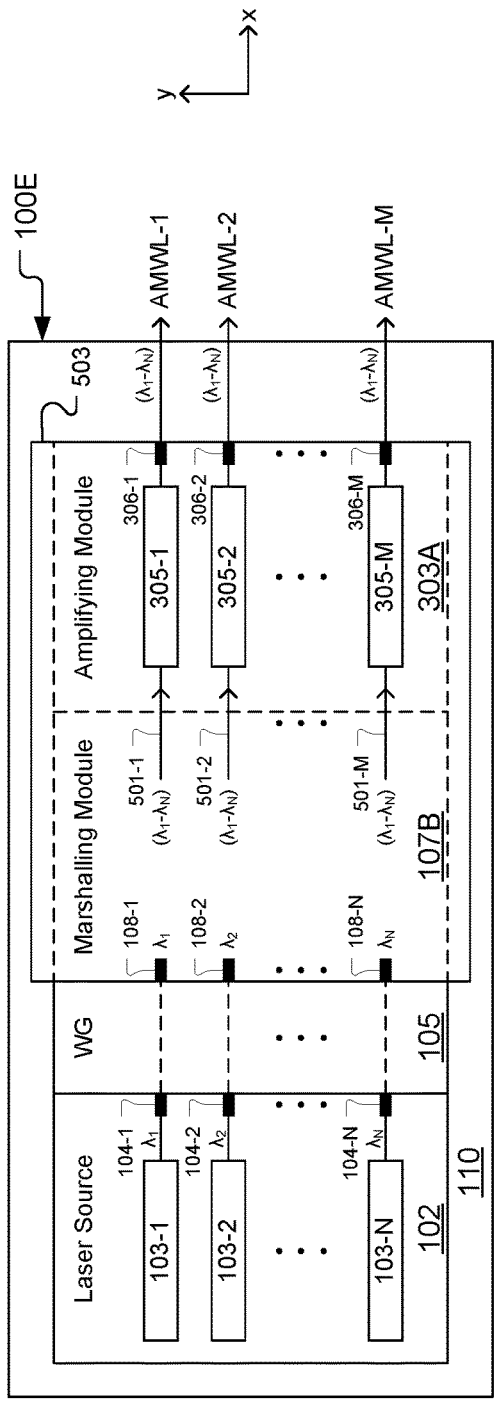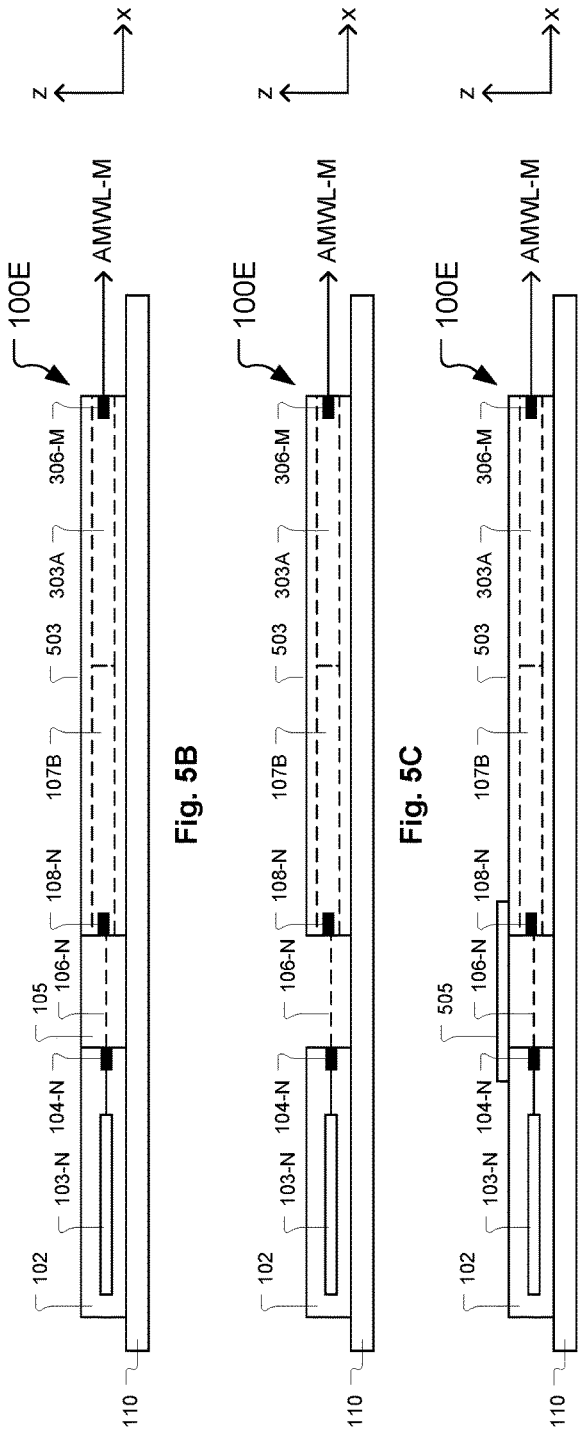

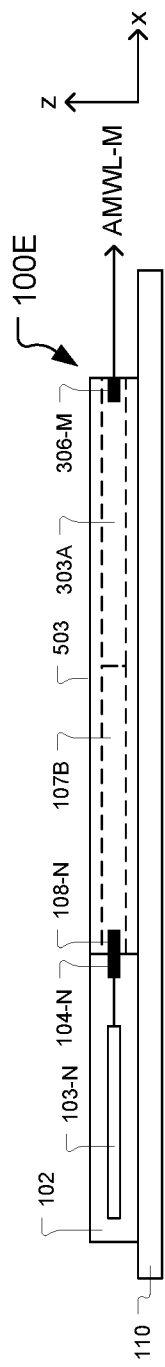
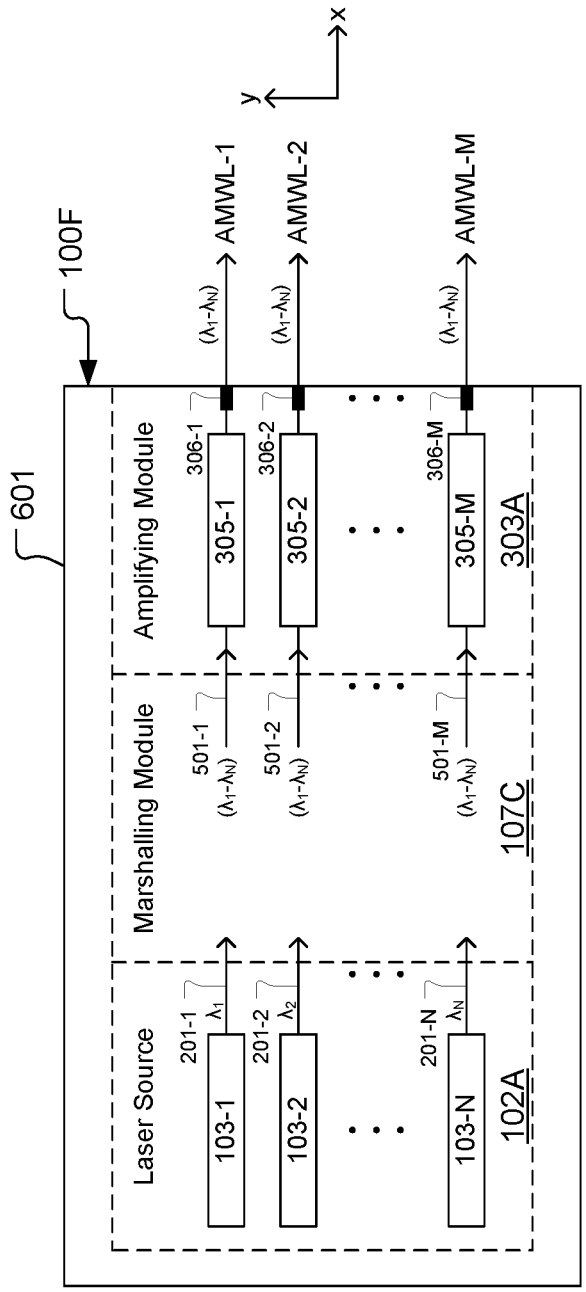
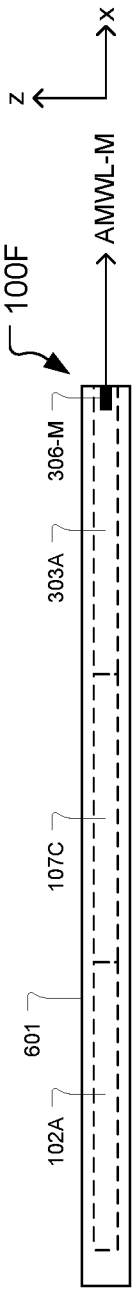
Fig. 5E
Fig. 6A
Fig. 6B

LASER MODULE FOR OPTICAL DATA COMMUNICATION SYSTEM

CLAIM OF PRIORITY

This application claims priority under 35 U.S.C. 119(e) to U.S. Provisional Patent Application No. 62/362,551, filed Jul. 14, 2016, the disclosure of which is incorporated herein by reference in its entirety for all purposes.

BACKGROUND

1. Field of the Invention

The present invention relates to optical data communication.

2. Description of the Related Art

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient laser light sources. Also, it is desirable for the laser light sources of optical data communication systems to have a minimal form factor and be designed as efficiently as possible with regard to expense and energy consumption. It is within this context that the present invention arises.

SUMMARY

In an example embodiment, a laser module is disclosed. The laser module includes a laser source configured to generate and output a plurality of laser beams. The plurality of laser beams have different wavelengths relative to each other. The different wavelengths are distinguishable to an optical data communication system. The laser module also includes an optical marshalling module configured to receive the plurality of laser beams from the laser source and distribute a portion of each of the plurality of laser beams to each of a plurality of optical output ports of the optical marshalling module, such that all of the different wavelengths of the plurality of laser beams are provided to each of the plurality of optical output ports of the optical marshalling module. In some embodiments, the laser module can include an optical amplifying module configured to amplify laser light received from each of the plurality of optical output ports of the optical marshalling module. The optical amplifying module is configured to provide amplified laser light for each of the plurality of optical output ports of the optical marshalling module to a corresponding plurality of optical output ports of the optical amplifying module.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 3A shows an architectural diagram of a laser module that includes the laser source, the optical marshalling module, and an optical amplifying module, in accordance with some embodiments of the present invention.

FIG. 3B shows a side view of the laser module in which the optical waveguide is present and the optical waveguide is present, in accordance with some embodiments of the present invention.

FIG. 3C shows a side view of the laser module in which the optical waveguide is present and the optical waveguide is not present, in accordance with some embodiments of the present invention.

FIG. 3D shows a side view of the laser module configuration of FIG. 3C in which the empty space between the optical marshalling module and the optical amplifying module is covered and/or sealed by a member, in accordance with some embodiments of the present invention.

FIG. 3E shows a side view of the laser module in which the optical waveguide is present and the optical waveguide is not present and in which the optical marshalling module and the optical amplifying module are positioned in a side-by-side contacting manner, in accordance with some embodiments of the present invention.

FIG. 3F shows a side view of the laser module in which the optical waveguide is not present and in which the optical marshalling module and the optical amplifying module are positioned in a vertically overlapping and contacting manner, in accordance with some embodiments of the present invention.

FIG. 3G shows a side view of the laser module configuration of FIG. 3F in which the optical amplifying module is configured to extend across the optical marshalling module, the optical waveguide, and the laser source, such that the optical amplifying module provides physical support for placement of each of the optical marshalling module, the optical waveguide, and the laser source within the laser module, in accordance with some embodiments of the present invention.

FIG. 3H shows a side view of a modification of the laser module configuration of FIG. 3B in which the optical waveguide is not present, in accordance with some embodiments of the present invention.

FIG. 3I shows a side view of a modification of the laser module configuration of FIG. 3C in which the optical waveguide is not present, in accordance with some embodiments of the present invention.

FIG. 3J shows a side view of a modification of the laser module configuration of FIG. 3E in which the optical waveguide is not present, in accordance with some embodiments of the present invention.

FIG. 3K shows a side view of a modification of the laser module configuration of FIG. 3F in which the optical waveguide is not present, in accordance with some embodiments of the present invention.

FIG. 3L shows a side view of a modification of the laser module configuration of FIG. 3G in which the optical waveguide is not present, in accordance with some embodiments of the present invention.

FIG. 3M shows a side view of a modification of the laser module configuration of FIG. 3B in which the laser source and the optical marshalling module are positioned in a side-by-side contacting manner, in accordance with some embodiments of the present invention.

FIG. 3N shows a side view of a modification of the laser module configuration of FIG. 3C in which the laser source and the optical marshalling module are positioned in a side-by-side contacting manner, in accordance with some embodiments of the present invention.

FIG. 3O shows a side view of a modification of the laser module configuration of FIG. 3E in which the laser source and the optical marshalling module are positioned in a side-by-side contacting manner, in accordance with some embodiments of the present invention.

FIG. 3P shows a side view of a modification of the laser module configuration of FIG. 3F in which the laser source and the optical marshalling module are positioned in a side-by-side contacting manner, in accordance with some embodiments of the present invention.

FIG. 3Q shows a side view of a modification of the laser module configuration of FIG. 3G in which the laser source and the optical marshalling module are positioned in a side-by-side contacting manner, in accordance with some embodiments of the present invention.

FIG. 3R shows a side view of a modification of the laser module configuration of FIG. 3B in which the laser source and the optical marshalling module are positioned in a vertically overlapping and contacting manner, in accordance with some embodiments of the present invention.

FIG. 3S shows a side view of a modification of the laser module configuration of FIG. 3R in which the optical marshalling module is configured to extend across the laser source, the optical waveguide, and the optical amplifying module, in accordance with some embodiments of the present invention.

FIG. 3T shows a side view of a modification of the laser module configuration of FIG. 3R in which the optical waveguide is not present, in accordance with some embodiments of the present invention.

FIG. 3U shows a side view of a modification of the laser module configuration of FIG. 3S in which the optical waveguide is not present, in accordance with some embodiments of the present invention.

FIG. 3V shows a side view of a modification of the laser module configuration of FIG. 3T in which the optical waveguide is not present and in which the optical marshalling module and the optical amplifying module are positioned in a side-by-side contacting manner, in accordance with some embodiments of the present invention.

FIG. 3W shows a side view of a modification of the laser module configuration of FIG. 3S in which the optical waveguide is not present and in which the optical marshalling module and the optical amplifying module are positioned in a side-by-side contacting manner, in accordance with some embodiments of the present invention.

FIG. 3X shows a side view of a modification of the laser module configuration of FIG. 3R in which the optical waveguide is not present and in which the optical marshalling module and the optical amplifying module are positioned in a vertically overlapping and contacting manner, in accordance with some embodiments of the present invention.

FIG. 5A shows an architectural diagram of a laser module in which an optical marshalling module and an amplifying module are implemented together within a same PLC, in accordance with some embodiments of the present invention.

FIG. 5B shows a side view of the laser module configuration of FIG. 5A, in accordance with some embodiments of the present invention.

FIG. 5C shows a side view of the laser module configuration of FIG. 5B in which the optical waveguide is not present, in accordance with some embodiments of the present invention.

FIG. 5D shows a side view of the laser module configuration of FIG. 5C in which the empty space between the laser source and the PLC is covered and/or sealed by a member, in accordance with some embodiments of the present invention.

FIG. 5E shows a side view of the laser module in which the optical waveguide is not present and in which the laser source and the PLC are positioned in a side-by-side contacting manner, in accordance with some embodiments of the present invention.

FIG. 6A shows an architectural diagram of a laser module in which the laser source, an optical marshalling module, and the amplifying module are implemented together within a same PLC, in accordance with some embodiments of the present invention.

FIG. 6B shows a side view of the laser module configuration of FIG. 6A, in accordance with some embodiments of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Various embodiments of a laser module and associated methods are disclosed herein. The laser module is designed and configured to supply laser light having one or more wavelengths. It should be understood that the term "wavelength" as used herein refers to the wavelength of electromagnetic radiation. And, the term "light" as used herein refers to electromagnetic radiation within a portion of the electromagnetic spectrum that is usable by optical data communication systems. In some embodiments, the portion of the electromagnetic spectrum includes light having wavelengths within a range extending from about 1100 nanometers to about 1565 nanometers (covering from the O-Band to the C-Band, inclusively, of the electromagnetic spectrum). However, it should be understood that the portion of the electromagnetic spectrum as referred to herein can include light having wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum. Also, the term "laser beam" as used herein refers to a beam of light generated by a laser device. It should be understood that a laser beam may be confined to propagate in an optical waveguide, such as (but not limited to) an optical fiber or an optical waveguide within a planar lightwave circuit (PLC). In some embodiments, the laser beam is polarized. And, in some embodiments, the light of a given laser beam has a single wavelength, where the single wavelength can refer to either essentially one wavelength or can refer to a narrow band of wavelengths that can be identified and processed by an optical data communication system as if it were a single wavelength.

Figure 1A:
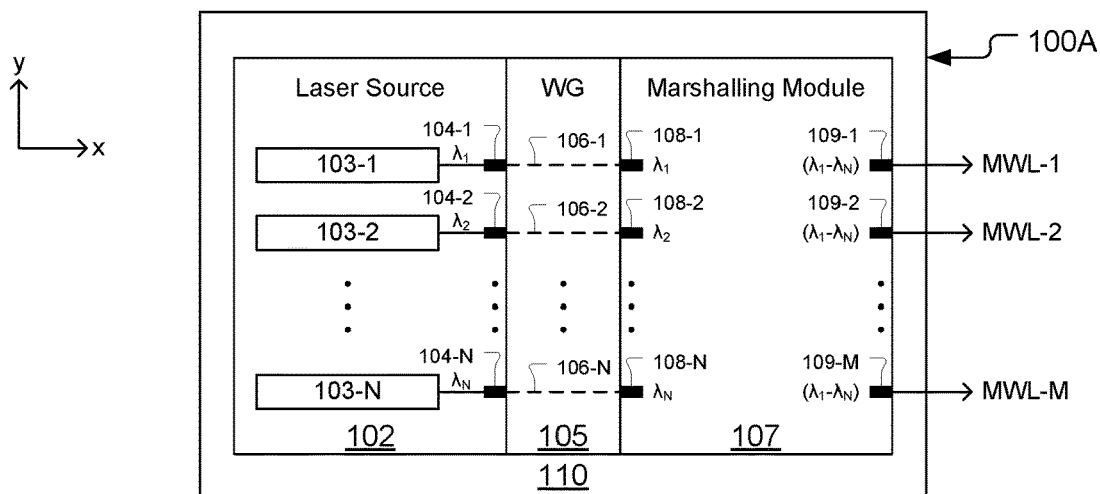
FIG. 1A shows an architectural diagram of a laser module, in accordance with some embodiments of the present invention.

FIG. 1A shows an architectural diagram of a laser module 100A, in accordance with some embodiments of the present invention. The laser module 100A includes a laser source 102 and an optical marshalling module 107. The laser source 102 is configured to generate and output a plurality of laser beams, i.e., (N) laser beams. The plurality of laser beams have different wavelengths ($\lambda_1$-$\lambda_N$) relative to each other, where the different wavelengths ($\lambda_1$-$\lambda_N$) are distinguishable to an optical data communication system. In some embodiments, the laser source 102 includes a plurality of lasers 103-1 to 103-N for respectively generating the plurality (N) of laser beams, where each laser 103-1 to 103-N generates and outputs a laser beam at a respective one of the different wavelengths ($\lambda_1$-$\lambda_N$). Each laser beam generated by the plurality of lasers 103-1 to 103-N is provided to a respective optical output port 104-1 to 104-N of the laser source 102 for transmission from the laser source 102. In some embodiments, each of the plurality of lasers 103-1 to 103-N is a distributed feedback laser configured to generate laser light at a particular one of the different wavelengths ($\lambda_1$-$\lambda_N$). In some embodiments, the laser source 102 can be defined as a separate component, such as a separate chip. However, in other embodiments, the laser source 102 can be integrated within a planar lightwave circuit (PLC) on a chip that includes other components in addition to the laser source 102.

In the example embodiment of FIG. 1A, the laser source 102 is defined as a separate component attached to a substrate 110, such as an electronic packaging substrate. In various embodiments, the substrate 110 can be an organic substrate or a ceramic substrate, or essentially any other type of substrate upon which electronic devices and/or optical-electronic devices and/or optical waveguides and/or optical fiber(s)/fiber ribbon(s) can be mounted. For example, in some embodiments, the substrate 110 can be an Indium-Phosphide (III-V) substrate. Or, in another example, the substrate 110 can be an $Al_2O_3$ substrate. It should be understood that in various embodiments the laser source 102 can be attached/mounted to the substrate 110 using essentially any known electronic packaging process, such as flip-chip bonding, which can optionally include disposition of a ball grid array (BGA), bumps, solder, under-fill, and/or other component(s), between the laser source 102 and the substrate 110, and include bonding techniques such as mass reflow, thermal-compression bonding (TCB), or essentially any other suitable bonding technique.

The optical marshalling module 107 is configured to receive the plurality of laser beams of the different wavelengths ($\lambda_1$-$\lambda_N$) from the laser source 102 at a corresponding plurality of optical input ports 108-1 to 108-N of the optical marshalling module 107. The optical marshalling module 107 is also configured to distribute a portion of each of the plurality of laser beams to each of a plurality of optical output ports 109-1 to 109-M of the optical marshalling module 107, where (M) is the number of optical output ports of the optical marshalling module 107. The optical marshalling module 107 operates to distribute the plurality of laser beams such that all of the different wavelengths ($\lambda_1$-$\lambda_N$) of the plurality of laser beams are provided to each of the plurality of optical output ports 109-1 to 109-M of the optical marshalling module 107. Therefore, it should be understood that the optical marshalling module 107 operates to provide light at all of the different wavelengths ($\lambda_1$-$\lambda_N$) of the plurality of laser beams to each one of the optical output ports 109-1 to 109-M of the optical marshalling module 107, as indicated in FIG. 1A. In this manner, for the laser module 100A, each one of the optical output ports 109-1 to 109-M of the optical marshalling module 107 provides a corresponding one of a plurality of multi-wavelength laser outputs MWL-1 to MWL-M.

In some embodiments, the optical marshalling module 107 is configured to maintain a polarization of each of the plurality of laser beams between the plurality of optical input ports 108-1 to 108-N of the optical marshalling module 107 and the plurality of optical output ports 109-1 to 109-M of the optical marshalling module 107. Also, in some embodiments, the optical marshalling module 107 is configured such that each of the plurality of optical output ports 109-1 to 109-M of the optical marshalling module 107 receives a similar amount of optical power of any given one of the plurality of laser beams within a factor of five. In other words, in some embodiments, the amount of light of a given wavelength, i.e., one of the different wavelengths ($\lambda_1$-$\lambda_N$), that is provided by the optical marshalling module 107 to a particular one of the optical output ports 109-1 to 109-M is the same within a factor of five to the amount of light of the given wavelength that is provided by the optical marshalling module 107 to others of the optical output ports 109-1 to 109-M. It should be understood that the factor of five mentioned above is an example embodiment. In other embodiments, the factor of five mentioned above can be changed to a factor of another value, such as to a factor of two, or three, or four, or six, etc., or to any other value in between or less than or greater than. The point to be understood is that the optical marshalling module 107 can be configured to control the amount of light of a given wavelength that is provided to each of the optical output ports 109-1 to 109-M of the optical marshalling module 107, and in turn can be configured to control a uniformity of the amount of light of a given wavelength provided to each of the optical output ports 109-1 to 109-M of the optical marshalling module 107.

In the example embodiment, of FIG. 1A, the optical marshalling module 107 is defined as a separate component attached to the substrate 110. Therefore, it should be understood that in the example embodiment of the laser module 100A, the laser source 102 and the optical marshalling module 107 are physically separate components. It should be understood that in various embodiments the optical marshalling module 107 can be attached/mounted to the substrate 110 using essentially any known electronic packaging process. Also, in some embodiments, the optical marshalling module 107 is configured as a non-electrical component, i.e., as a passive component, and can be attached/mounted to the substrate 110 using techniques that do not involve establishment of electrical connections between the optical marshalling module 107 and the substrate 110, such as by use of an epoxy or other type of adhesive material. In some embodiments, rather than being defined as a separate component, the optical marshalling module 107 can be integrated within a PLC on a chip that includes other components in addition to the optical marshalling module 107. In some embodiments, both the optical marshalling module 107 and the laser source 102 are implemented together within a same PLC.

The laser source 102 is aligned with the optical marshalling module 107 to direct the plurality of laser beams transmitted from the optical outputs 104-1 to 104-N of the laser source 102 into respective ones of the optical input ports 108-1 to 108-N of the optical marshalling module 107. In some embodiments, the optical marshalling module 107 is positioned spaced apart from the laser source 102. In some embodiments, the optical marshalling module 107 is positioned in contact with the laser source 102. And, in some embodiments, a portion of the optical marshalling module 107 is positioned to overlap a portion of the laser source 102. In the example embodiment of the laser module 100A as shown in FIG. 1A, the optical marshalling module 107 is positioned spaced apart from the laser source 102, and an optical waveguide 105 is positioned between the laser source 102 and the optical marshalling module 107. The optical waveguide 105 is configured to direct the plurality of laser beams from the laser source 102 into respective ones of the plurality of optical input ports 108-1 to 108-N of the optical marshalling module 107, as indicated by lines 106-1 to 106-N.

In various embodiments, the optical waveguide 105 can be formed of essentially any material through which light can be channeled from an entry location on the optical waveguide 105 to an exit location on the optical waveguide 105. For example, in various embodiments, the optical waveguide 105 can be formed of glass, SiN, SiO2, germanium-oxide, and/or silica, among other materials. In some embodiments, the optical waveguide 105 is configured to maintain a polarization of the plurality of laser beams between the laser source 102 and the optical marshalling module 107. In some embodiments, the optical waveguide 105 includes (N) optical conveyance channels, where each optical conveyance channel extends from a respective one of the optical output ports 104-1 to 104-N of the laser source 102 to a respective one of the optical input ports 108-1 to 108-N of the optical marshalling module 107. In some embodiments, each of the (N) optical conveyance channels of the optical waveguide 105 has a substantially rectangular cross-section in a plane normal to a direction of propagation of the laser beam, i.e., normal to the x-direction as shown in FIG. 1A, which serves to maintain a polarization of the laser beam as it propagates from the laser source 102 to the optical marshalling module 107.

In the example embodiment of FIG. 1A, the optical waveguide 105 is defined as a separate component attached to the substrate 110. Therefore, it should be understood that in the example embodiment of the laser module 100A, the laser source 102, the optical waveguide 105, and the optical marshalling module 107 are physically separate components. It should be understood that in various embodiments the optical waveguide 105 can be attached/mounted to the substrate 110 using essentially any known electronic packaging process. Also, in some embodiments, the optical waveguide 105 is configured as a non-electrical component, i.e., as a passive component, and can be attached/mounted to the substrate 110 using techniques that do not involve establishment of electrical connections between the optical waveguide 105 and the substrate 110, such as by use of an epoxy or other type of adhesive material. In some embodiments, rather than being defined as a separate component, the optical waveguide 105 can be integrated within a PLC on a chip that includes other components in addition to the optical waveguide 105. In some embodiments, laser source 102, the optical waveguide 105, and the optical marshalling module 107 are implemented together within a same PLC.

In some embodiments, the laser module 100A includes a thermal spreader component disposed proximate to the laser source 102. The thermal spreader component is configured to spread a thermal output of the plurality of lasers 103-1 to 103-N to provide substantial uniformity in temperature-dependent wavelength drift among the plurality of lasers 103-1 to 103-N. In some embodiments, the thermal spreader component is included within the laser source 102. In some embodiments, the thermal spreader component is included within the substrate 110. In some embodiments, the thermal spreader component is defined separate from each of the laser source 102, the optical marshalling module 107, and the substrate 110. In some embodiments, the thermal spreader component is included within the optical marshalling module 107, with the thermal spreader component portion of the optical marshalling module 107 physically overlapping the laser source 102. In some embodiments, the thermal spreader component is included within the optical waveguide 105, with the thermal spreader component portion of the optical waveguide 105 physically overlapping the laser source 102. In various embodiments, the thermal spreader component is formed of a thermally conductive material, such as a metallic material by way of example. In some embodiments, the thermal spreader component can incorporate an element configured to actively transfer heat away from the plurality of lasers 103-1 to 103-N, such as a thermoelectric cooler by way of example. Also, in some embodiments, the thermal spreader component is formed to have a sufficient bulk mass so as to function as a heat sink for heat emanating from the plurality of lasers 103-1 to 103-N of the laser source 102.

Figure 1B:
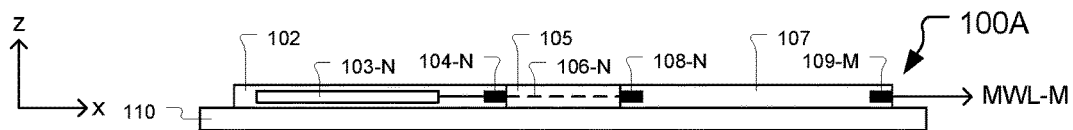
FIG. 1B shows a side view of the laser module in which the optical waveguide is present, in accordance with some embodiments of the present invention.

FIG. 1B shows a side view of the laser module 100A in which the optical waveguide 105 is present, in accordance with some embodiments of the present invention. In the embodiment of FIG. 1B, the laser source 102 and the optical marshalling module 107 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107, such that turning of the laser beams is not required at either the optical output ports 104-1 to 104-N of the laser source 102 or the optical input ports 108-1 to 108-N of the optical marshalling module 107.

Figure 1C:
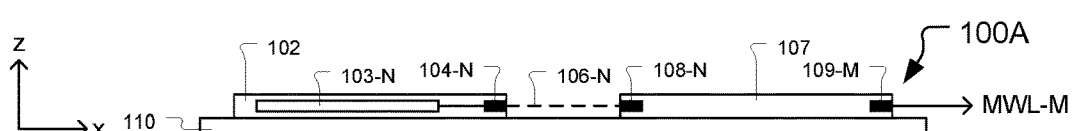
FIG. 1C shows a side view of the laser module in which the optical waveguide is not present, in accordance with some embodiments of the present invention

FIG. 1C shows a side view of the laser module 100A in which the optical waveguide 105 is not present, in accordance with some embodiments of the present invention. In the embodiment of FIG. 1C, the laser source 102 and the optical marshalling module 107 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107, such that turning of the laser beams is not required at either the optical output ports 104-1 to 104-N of the laser source 102 or the optical input ports 108-1 to 108-N of the optical marshalling module 107. In the embodiment of FIG. 1C, an empty space is present between the optical output ports 104-1 to 104-N of the laser source 102 and the optical input ports 108-1 to 108-N of the optical marshalling module 107. Therefore, in the embodiment of FIG. 1C, the laser beams output from the laser source 102 travel along respective straight line paths through the empty space between the laser source 102 and the optical marshalling module 107.

Figure 1D:
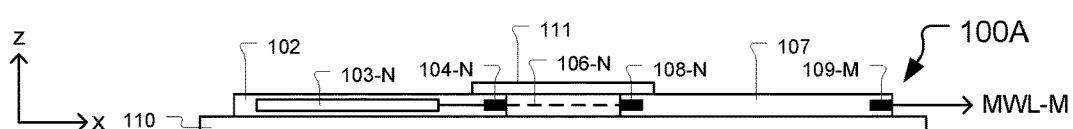
FIG. 1D shows a side view of the laser module configuration of FIG. 1C in which the empty space between the laser source and the optical marshalling module is covered and/or sealed by a member, in accordance with some embodiments of the present invention.

FIG. 1D shows a side view of the laser module 100A configuration of FIG. 1C in which the empty space between the laser source 102 and the optical marshalling module 107 is covered and/or sealed by a member 111. In various embodiments, the member 111 can be another chip placed during packaging, or can be another material placed during packaging, or can be an integral part of the laser source 102, or can be an integral part of the optical marshalling module 107.

Figure 1E:
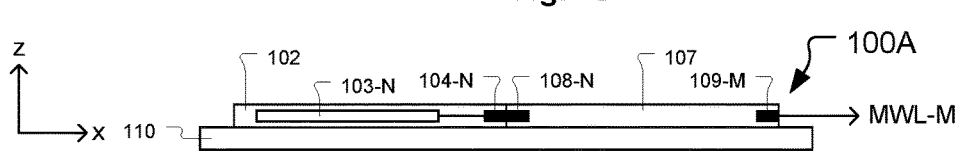
FIG. 1E shows a side view of the laser module in which the optical waveguide is not present and in which the laser source and the optical marshalling module are positioned in a side-by-side contacting manner, in accordance with some embodiments of the present invention.

FIG. 1E shows a side view of the laser module 100A in which the optical waveguide 105 is not present and in which the laser source 102 and the optical marshalling module 107 are positioned in a side-by-side contacting manner, in accordance with some embodiments of the present invention. In the example laser module 100A configuration of FIG. 1E, laser source 102 and the optical marshalling module 107 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107, such that turning of the laser beams is not required at either the optical output ports 104-1 to 104-N of the laser source 102 or the optical input ports 108-1 to 108-N of the optical marshalling module 107.

Figure 1F:
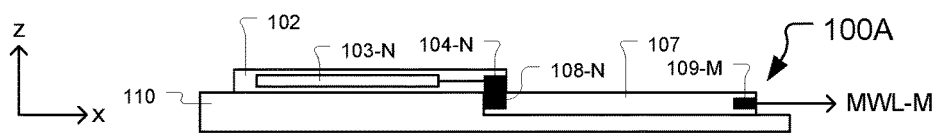
FIG. 1F shows a side view of the laser module in which the optical waveguide is not present and in which the laser source and the optical marshalling module are positioned in a vertically overlapping and contacting manner, in accordance with some embodiments of the present invention.
Figure 1G:
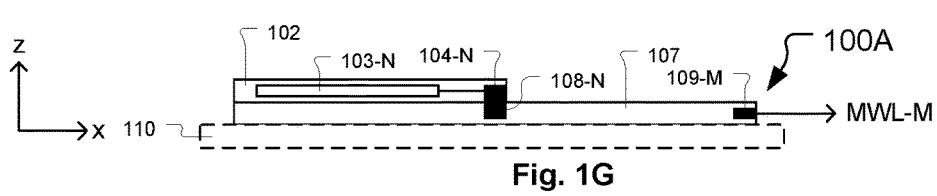
FIG. 1G shows a side view of the laser module configuration of FIG. 1F in which the optical marshalling module is configured to extend across the laser source, such that the optical marshalling module provides physical support for placement of the laser source within the laser module, in accordance with some embodiments of the present invention.

FIG. 1F shows a side view of the laser module 100A in which the optical waveguide 105 is not present and in which the laser source 102 and the optical marshalling module 107 are positioned in a vertically overlapping and contacting manner, in accordance with some embodiments of the present invention. In the example laser module 100A configuration of FIG. 1F, the substrate 110 is configured to support both the laser source 102 and the optical marshalling module 107. In the example laser module 100A configuration of FIG. 1F, the optical output ports 104-1 to 104-N of the laser source 102 are vertically aligned with the optical input ports 108-1 to 108-N, respectively, of the optical marshalling module 107, such that turning of the laser beams is done at both the optical output ports 104-1 to 104-N of the laser source 102 and the optical input ports 108-1 to 108-N of the optical marshalling module 107. FIG. 1G shows a side view of the laser module 100A configuration of FIG. 1F in which the optical marshalling module 107 is configured to extend across the laser source 102, such that the optical marshalling module 107 provides physical support for placement of the laser source 102 within the laser module 100A. In the example laser module 100A configuration of FIG. 1G, the substrate 110 may be omitted if the optical marshalling module 107 is formed to have sufficient mechanical strength for physically supporting itself and the laser source 102.

Figure 2A:
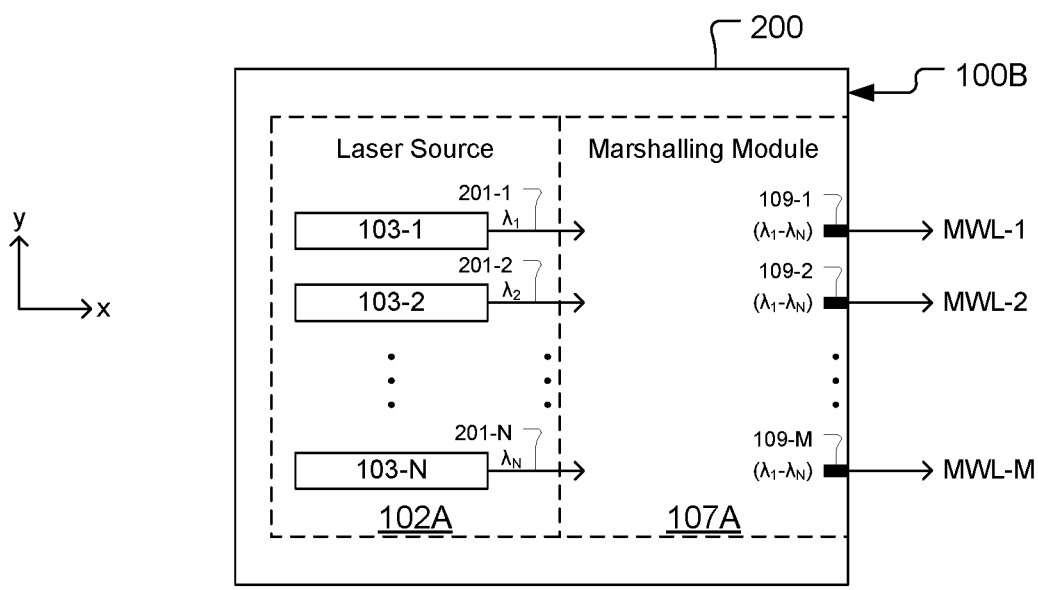
FIG. 2A shows an architectural diagram of a laser module, in accordance with some embodiments of the present invention.
Figure 2B:
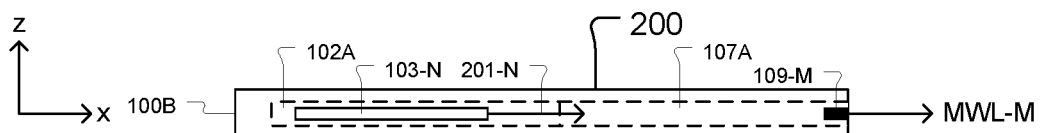
FIG. 2B shows a side view of the of PLC, in accordance with some embodiments of the present invention.

FIG. 2A shows an architectural diagram of a laser module 100B, in accordance with some embodiments of the present invention. The laser module 100B includes a laser source 102A and an optical marshalling module 107A implemented within a same PLC 200. The laser source 102A is configured to function in essentially the same manner as the laser source 102 described above with regard to the laser module 100A. The optical marshalling module 107A is configured to function in essentially the same manner as the optical marshalling module 107 described above with regard to the laser module 100A. FIG. 2B shows a side view of the of PLC 200, in accordance with some embodiments of the present invention. In the PLC 200, the laser source 102A and the optical marshalling module 107A are implemented in an integral manner with each other such that laser beams 201-1 to 201-N generated by the plurality of lasers 103-1 to 103-N are directed into the optical marshalling module 107A without having to travel through optical output ports and optical input ports, respectively. Also, in the PLC 200, the separate optical waveguide 105 is not needed due to the optical integration between the laser source 102A and the optical marshalling module 107A.

In some embodiments, the laser source 102 generates laser beams of sufficient power at the different wavelengths ($\lambda_1$-$\lambda_N$) such that the multi-wavelength laser outputs MWL-1 to MWL-M are output from the optical marshalling module 107/107A with sufficient power for use in optical data communication. However, in some embodiments, due to limitations in the laser source 102 output power and/or due to optical losses in the optical waveguide 105 and/or optical marshalling module 107, the multi-wavelength laser outputs MWL-1 to MWL-M are not output from the optical marshalling module 107/107A with sufficient power for use in optical data communication. Therefore, in some embodiments, the multi-wavelength laser outputs MWL-1 to MWL-M that are output from the optical marshalling module 107/107A need to be optically amplified prior to use in optical data communication. Each of the multi-wavelength laser outputs MWL-1 to MWL-M can be optically amplified using an optical amplifier. In various embodiments, the optical amplifiers can be implemented directly within the laser module.

FIG. 3A shows an architectural diagram of a laser module 100C that includes the laser source 102, the optical marshalling module 107, and an optical amplifying module 303, in accordance with some embodiments of the present invention. The laser source 102 is configured in the same manner as previously described with regard to the laser module 100A. Also, the optical marshalling module 107 is configured in the same manner as previously described with regard to the laser module 100A. And, in some embodiments, the laser module 100C can include the optical waveguide 105 positioned between the laser source 102 and the optical marshalling module 107, where the optical waveguide 105 is configured in the same manner as previously described with regard to the laser module 100A.

The optical amplifying module 303 is configured to receive the plurality of multi-wavelength laser outputs MWL-1 to MWL-M from the plurality of optical output ports 109-1 to 109-M of the optical marshalling module 107 at a corresponding plurality of optical input ports 304-1 to 304-M of the optical amplifying module 303. The optical amplifying module 303 includes a plurality of optical amplifiers 305-1 to 305-M for respectively amplifying the plurality of multi-wavelength laser outputs MWL-1 to MWL-M received at the plurality of optical input ports 304-1 to 304-M of the optical amplifying module 303. In various embodiments, the plurality of optical amplifiers 305-1 to 305-M can be defined as one or more of semiconductor optical amplifiers, erbium/ytterbium-doped fiber amplifiers, raman amplifiers, among others. The optical amplifiers 305-1 to 305-M are configured and optically connected to provide amplified versions of the plurality of multi-wavelength laser outputs AMWL-1 to AMWL-M to a plurality of optical output ports 306-1 to 306-M, respectively, of the optical amplifying module 303. In this manner, for the laser module 100C, each one of the optical output ports 306-1 to 306-M of the optical amplifying module 303 provides a corresponding one of a plurality of amplified multi-wavelength laser outputs AMWL-1 to AMWL-M. In some embodiments, the optical amplifying module 303 is configured to maintain a polarization of each of the plurality of laser beams between the plurality of optical input ports 304-1 to 304-M of the optical amplifying module 303 and the plurality of optical output ports 306-1 to 306-M of the optical amplifying module 303.

In the example embodiment, of FIG. 3A, the optical amplifying module 303 is defined as a separate component attached to the substrate 110. Therefore, it should be understood that in the example embodiment of the laser module 100C, the laser source 102, the optical marshalling module 107, and the optical amplifying module 303 are physically separate components. It should be understood that in various embodiments the optical amplifying module 303 can be attached/mounted to the substrate 110 using essentially any known electronic packaging process, such as flip-chip bonding, which can optionally include disposition of a ball grid array (BGA), bumps, solder, under-fill, and/or other component(s), between the optical amplifying module 303 and the substrate 110, and include bonding techniques such as mass reflow, thermal-compression bonding (TCB), or essentially any other suitable bonding technique.

The optical marshalling module 107 is aligned with the optical amplifying module 303 to direct the multi-wavelength laser outputs MWL-1 to MWL-M into respective ones of the optical input ports 304-1 to 304-M of the optical amplifying module 303. In some embodiments, the optical amplifying module 303 is positioned spaced apart from the optical marshalling module 107. In some embodiments, the optical amplifying module 303 is positioned in contact with the optical marshalling module 107. And, in some embodiments, a portion of the optical amplifying module 303 is positioned to overlap a portion of the optical marshalling module 107 and/or a portion of the laser source 102. In the example embodiment of the laser module 100C as shown in FIG. 3A, the optical amplifying module 303 is positioned spaced apart from the optical marshalling module 107, and an optical waveguide 301 is positioned between the optical marshalling module 107 and the optical amplifying module 303. The optical waveguide 301 is configured to direct the plurality of multi-wavelength laser outputs MWL-1 to MWL-M from the optical marshalling module 107 into respective ones of the plurality of optical input ports 304-1 to 304-M of the optical amplifying module 303.

In various embodiments, the optical waveguide 301 can be formed of essentially any material through which light can be channeled from an entry location on the optical waveguide 301 to an exit location on the optical waveguide 301. For example, in various embodiments, the optical waveguide 301 can be formed of glass, SiN, SiO2, germanium-oxide, and/or silica, among other materials. In some embodiments, the optical waveguide 301 is configured to maintain a polarization of the plurality of multi-wavelength laser outputs MWL-1 to MWL-M between the optical marshalling module 107 and the optical amplifying module 303. In some embodiments, the optical waveguide 301 includes (M) optical conveyance channels, where each optical conveyance channel extends from a respective one of the optical output ports 109-1 to 109-M of the optical marshalling module 107 to a respective one of the optical input ports 304-1 to 304-M of the optical amplifying module 303. In some embodiments, each of the (M) optical conveyance channels of the optical waveguide 301 has a substantially rectangular cross-section in a plane normal to a direction of propagation of the multi-wavelength laser output, i.e., normal to the x-direction as shown in FIG. 3A, which serves to maintain a polarization of the multi-wavelength laser output as it propagates from the optical marshalling module 107 to the optical amplifying module 303.

In the example embodiment of FIG. 3A, the optical waveguide 301 is defined as a separate component attached to the substrate 110. Therefore, it should be understood that in the example embodiment of the laser module 100C, the laser source 102, the optical waveguide 105, the optical marshalling module 107, the optical waveguide 301, and the optical amplifying module 303 are physically separate components. It should be understood that in various embodiments the optical waveguide 301 can be attached/mounted to the substrate 110 using essentially any known electronic packaging process. Also, in some embodiments, the optical waveguide 301 is configured as a non-electrical component, i.e., as a passive component, and can be attached/mounted to the substrate 110 using techniques that do not involve establishment of electrical connections between the optical waveguide 301 and the substrate 110, such as by use of an epoxy or other type of adhesive material. In some embodiments, rather than being defined as a separate component, the optical waveguide 301 can be integrated within a PLC on a chip that includes other components in addition to the optical waveguide 301. In some embodiments, two or more of the laser source 102, the optical waveguide 105, the optical marshalling module 107, the optical waveguide 301, and the optical amplifying module 303 are implemented together within a same PLC.

FIG. 3B shows a side view of the laser module 100C in which the optical waveguide 105 is present and the optical waveguide 301 is present, in accordance with some embodiments of the present invention. In the embodiment of FIG. 3B, the laser source 102 and the optical marshalling module 107 and the optical amplifying module 303 are positioned in a substantially co-planar manner on the substrate 110, such that the optical output ports 104-1 to 104-N of the laser source 102 are horizontally aligned with the optical input ports 108-1 to 108-N, respectively, of the optical marshalling module 107, and such that the optical output ports 109-1 to 109-M of the optical marshalling module 107 are horizontally aligned with the optical input ports 304-1 to 304-M, respectively, of the optical amplifying module 303. In this manner, in the example embodiment of FIG. 3B, turning of the laser beams is not required at either the optical output ports 104-1 to 104-N of the laser source 102 or the optical input ports 108-1 to 108-N of the optical marshalling module 107 or at the optical output ports 109-1 to 109-M of the optical marshalling module 107 or at the optical input ports 304-1 to 304-M of the optical amplifying module 303.

FIG. 3C shows a side view of the laser module 100C in which the optical waveguide 105 is present and the optical waveguide 301 is not present, in accordance with some embodiments of the present invention. In the embodiment of FIG. 3C, the laser source 102 and the optical marshalling module 107 and the optical amplifying module 303 are positioned in a substantially co-planar manner on the substrate 110, such that the optical output ports 104-1 to 104-N of the laser source 102 are horizontally aligned with the optical input ports 108-1 to 108-N, respectively, of the optical marshalling module 107, and such that the optical output ports 109-1 to 109-M of the optical marshalling module 107 are horizontally aligned with the optical input ports 304-1 to 304-M, respectively, of the optical amplifying module 303. In this manner, in the example embodiment of FIG. 3C, turning of the laser beams is not required at either the optical output ports 104-1 to 104-N of the laser source 102 or the optical input ports 108-1 to 108-N of the optical marshalling module 107 or at the optical output ports 109-1 to 109-M of the optical marshalling module 107 or at the optical input ports 304-1 to 304-M of the optical amplifying module 303. In the embodiment of FIG. 3C, an empty space is present between the optical output ports 109-1 to 109-M of the optical marshalling module 107 and the optical input ports 304-1 to 304-M of the optical amplifying module 303. Therefore, in the embodiment of FIG. 3C, the multi-wavelength laser outputs MWL-1 to MWL-M travel along respective straight line paths through the empty space between the optical marshalling module 107 and the optical amplifying module 303. FIG. 3D shows a side view of the laser module 100C configuration of FIG. 3C in which the empty space between the optical marshalling module 107 and the optical amplifying module 303 is covered and/or sealed by a member 307, in accordance with some embodiments of the present invention. In various embodiments, the member 307 can be another chip placed during packaging, or can be another material placed during packaging, or can be an integral part of the laser source 102, or can be an integral part of the optical marshalling module 107, or can be an integral part of the optical waveguide 105, or can be an integral part of the optical amplifying module 303.

FIG. 3E shows a side view of the laser module 100C in which the optical waveguide 105 is present and the optical waveguide 301 is not present and in which the optical marshalling module 107 and the optical amplifying module 303 are positioned in a side-by-side contacting manner, in accordance with some embodiments of the present invention. In the example laser module 100C configuration of FIG. 3E, the optical marshalling module 107 and the optical amplifying module 303 are positioned in a substantially co-planar manner on the substrate 110 such that the optical output ports 109-1 to 109-M of the optical marshalling module 107 are horizontally aligned with the optical input ports 304-1 to 304-M, respectively, of the optical amplifying module 303, such that turning of the laser beams is not required at either the optical output ports 109-1 to 109-M of the optical marshalling module 107 or the optical input ports 304-1 to 304-M of the optical amplifying module 303.

FIG. 3F shows a side view of the laser module 100C in which the optical waveguide 301 is not present and in which the optical marshalling module 107 and the optical amplifying module 303 are positioned in a vertically overlapping and contacting manner, in accordance with some embodiments of the present invention. In the example laser module 100C configuration of FIG. 3F, the substrate 110 is configured to support each of the laser source 102, the optical waveguide 105, the optical marshalling module 107, and the optical amplifying module 303. In the example laser module 100C configuration of FIG. 3F, the optical output ports 109-1 to 109-M of the optical marshalling module 107 are vertically aligned with the optical input ports 304-1 to 304-M, respectively, of the optical amplifying module 303, such that turning of the laser beams is done at both the optical output ports 109-1 to 109-M of the optical marshalling module 107 and the optical input ports 304-1 to 304-M of the optical amplifying module 303.

FIG. 3G shows a side view of the laser module 100C configuration of FIG. 3F in which the optical amplifying module 303 is configured to extend across the optical marshalling module 107, the optical waveguide 105, and the laser source 102, such that the optical amplifying module 303 provides physical support for placement of each of the optical marshalling module 107, the optical waveguide 105, and the laser source 102 within the laser module 100C, in accordance with some embodiments of the present invention. In the example laser module 100C configuration of FIG. 3G, the substrate 110 may be omitted if the optical amplifying module 303 is formed to have sufficient mechanical strength for physically supporting itself and each of the optical marshalling module 107, the optical waveguide 105, and the laser source 102.

FIG. 3H shows a side view of a modification of the laser module 100C configuration of FIG. 3B in which the optical waveguide 105 is not present, in accordance with some embodiments of the present invention. In this manner, the laser module 100C configuration of FIG. 3H represents the laser module 100C of FIG. 3B modified to have the features discussed above with regard to the laser module 100A of FIG. 1C concerning the absence of the optical waveguide 105.

FIG. 3I shows a side view of a modification of the laser module 100C configuration of FIG. 3C in which the optical waveguide 105 is not present, in accordance with some embodiments of the present invention. In this manner, the laser module 100C configuration of FIG. 3I represents the laser module 100C of FIG. 3C modified to have the features discussed above with regard to the laser module 100A of FIG. 1C concerning the absence of the optical waveguide 105.

FIG. 3J shows a side view of a modification of the laser module 100C configuration of FIG. 3E in which the optical waveguide 105 is not present, in accordance with some embodiments of the present invention. In this manner, the laser module 100C configuration of FIG. 3J represents the laser module 100C of FIG. 3E modified to have the features discussed above with regard to the laser module 100A of FIG. 1C concerning the absence of the optical waveguide 105.

FIG. 3K shows a side view of a modification of the laser module 100C configuration of FIG. 3F in which the optical waveguide 105 is not present, in accordance with some embodiments of the present invention. In this manner, the laser module 100C configuration of FIG. 3K represents the laser module 100C of FIG. 3F modified to have the features discussed above with regard to the laser module 100A of FIG. 1C concerning the absence of the optical waveguide 105.

FIG. 3L shows a side view of a modification of the laser module 100C configuration of FIG. 3G in which the optical waveguide 105 is not present, in accordance with some embodiments of the present invention. In this manner, the laser module 100C configuration of FIG. 3L represents the laser module 100C of FIG. 3G modified to have the features discussed above with regard to the laser module 100A of FIG. 1C concerning the absence of the optical waveguide 105.

FIG. 3M shows a side view of a modification of the laser module 100C configuration of FIG. 3B in which the laser source 102 and the optical marshalling module 107 are positioned in a side-by-side contacting manner, in accordance with some embodiments of the present invention. In this manner, the laser module 100C configuration of FIG. 3M represents the laser module 100C of FIG. 3B modified to have the features discussed above with regard to the laser module 100A of FIG. 1E concerning the positioning of the laser source 102 and the optical marshalling module 107 in the side-by-side contacting manner.

FIG. 3N shows a side view of a modification of the laser module 100C configuration of FIG. 3C in which the laser source 102 and the optical marshalling module 107 are positioned in a side-by-side contacting manner, in accordance with some embodiments of the present invention. In this manner, the laser module 100C configuration of FIG. 3N represents the laser module 100C of FIG. 3C modified to have the features discussed above with regard to the laser module 100A of FIG. 1E concerning the positioning of the laser source 102 and the optical marshalling module 107 in the side-by-side contacting manner.

FIG. 3O shows a side view of a modification of the laser module 100C configuration of FIG. 3E in which the laser source 102 and the optical marshalling module 107 are positioned in a side-by-side contacting manner, in accordance with some embodiments of the present invention. In this manner, the laser module 100C configuration of FIG. 3O represents the laser module 100C of FIG. 3E modified to have the features discussed above with regard to the laser module 100A of FIG. 1E concerning the positioning of the laser source 102 and the optical marshalling module 107 in the side-by-side contacting manner.

FIG. 3P shows a side view of a modification of the laser module 100C configuration of FIG. 3F in which the laser source 102 and the optical marshalling module 107 are positioned in a side-by-side contacting manner, in accordance with some embodiments of the present invention. In this manner, the laser module 100C configuration of FIG. 3P represents the laser module 100C of FIG. 3F modified to have the features discussed above with regard to the laser module 100A of FIG. 1E concerning the positioning of the laser source 102 and the optical marshalling module 107 in the side-by-side contacting manner.

FIG. 3Q shows a side view of a modification of the laser module 100C configuration of FIG. 3G in which the laser source 102 and the optical marshalling module 107 are positioned in a side-by-side contacting manner, in accordance with some embodiments of the present invention. In this manner, the laser module 100C configuration of FIG. 3Q represents the laser module 100C of FIG. 3G modified to have the features discussed above with regard to the laser module 100A of FIG. 1E concerning the positioning of the laser source 102 and the optical marshalling module 107 in the side-by-side contacting manner.

FIG. 3R shows a side view of a modification of the laser module 100C configuration of FIG. 3B in which the laser source 102 and the optical marshalling module 107 are positioned in a vertically overlapping and contacting manner, in accordance with some embodiments of the present invention. In this manner, the laser module 100C configuration of FIG. 3R represents the laser module 100C of FIG. 3B modified to have the features discussed above with regard to the laser module 100A of FIG. 1F concerning the positioning of the laser source 102 and the optical marshalling module 107 in the vertically overlapping and contacting manner.

FIG. 3S shows a side view of a modification of the laser module 100C configuration of FIG. 3R in which the optical marshalling module 107 is configured to extend across the laser source 102, the optical waveguide 301, and the optical amplifying module 303, in accordance with some embodiments of the present invention. In the laser module 100C configuration of FIG. 3S, the optical marshalling module 107 provides physical support for placement of the laser source 102, the optical waveguide 301, and the optical amplifying module 303. In the example laser module 100C configuration of FIG. 1S, the substrate 110 may be omitted if the optical marshalling module 107 is formed to have sufficient mechanical strength for physically supporting itself and each of the laser source 102, the optical waveguide 301, and the optical amplifying module 303.

FIG. 3T shows a side view of a modification of the laser module 100C configuration of FIG. 3R in which the optical waveguide 301 is not present, in accordance with some embodiments of the present invention. In this manner, the laser module 100C configuration of FIG. 3T represents the laser module 100C of FIG. 3R modified to have the features discussed above with regard to the laser module 100A of FIG. 3C concerning the absence of the optical waveguide 301.

FIG. 3U shows a side view of a modification of the laser module 100C configuration of FIG. 3S in which the optical waveguide 301 is not present, in accordance with some embodiments of the present invention. In this manner, the laser module 100C configuration of FIG. 3U represents the laser module 100C of FIG. 3S modified to have the features discussed above with regard to the laser module 100A of FIG. 3C concerning the absence of the optical waveguide 301.

FIG. 3V shows a side view of a modification of the laser module 100C configuration of FIG. 3T in which the optical waveguide 301 is not present and in which the optical marshalling module 107 and the optical amplifying module 303 are positioned in a side-by-side contacting manner, in accordance with some embodiments of the present invention. In this manner, the laser module 100C configuration of FIG. 3V represents the laser module 100C of FIG. 3T modified to have the features discussed above with regard to the laser module 100A of FIG. 3E concerning the absence of the optical waveguide 301 and the positioning of the optical marshalling module 107 and the optical amplifying module 303 in the side-by-side contacting manner.

FIG. 3W shows a side view of a modification of the laser module 100C configuration of FIG. 3S in which the optical waveguide 301 is not present and in which the optical marshalling module 107 and the optical amplifying module 303 are positioned in a side-by-side contacting manner, in accordance with some embodiments of the present invention. In this manner, the laser module 100C configuration of FIG. 3W represents the laser module 100C of FIG. 3S modified to have the features discussed above with regard to the laser module 100A of FIG. 3E concerning the absence of the optical waveguide 301 and the positioning of the optical marshalling module 107 and the optical amplifying module 303 in the side-by-side contacting manner.

FIG. 3X shows a side view of a modification of the laser module 100C configuration of FIG. 3R in which the optical waveguide 301 is not present and in which the optical marshalling module 107 and the optical amplifying module 303 are positioned in a vertically overlapping and contacting manner, in accordance with some embodiments of the present invention. In this manner, the laser module 100C configuration of FIG. 3X represents the laser module 100C of FIG. 3R modified to have the features discussed above with regard to the laser module 100A of FIG. 3F concerning the absence of the optical waveguide 301 and the positioning of the optical marshalling module 107 and the optical amplifying module 303 in the vertically overlapping and contacting manner.

Figure 3Y:
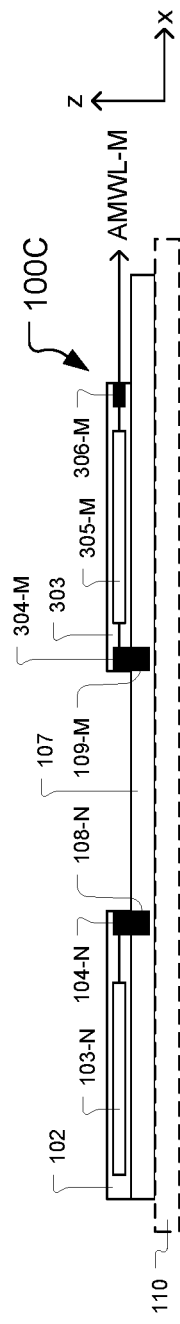
FIG. 3Y shows a side view of a modification of the laser module configuration of FIG. 3X in which the optical marshalling module is configured to extend across the laser source and the optical amplifying module, such that the optical marshalling module provides physical support for placement of each of the laser source and the optical amplifying module within the laser module, in accordance with some embodiments of the present invention.

FIG. 3Y shows a side view of a modification of the laser module 100C configuration of FIG. 3X in which the optical marshalling module 107 is configured to extend across the laser source 102 and the optical amplifying module 303, such that the optical marshalling module 107 provides physical support for placement of each of the laser source 102 and the optical amplifying module 303 within the laser module 100C, in accordance with some embodiments of the present invention. In the example laser module 100C configuration of FIG. 3Y, the substrate 110 may be omitted if the optical marshalling module 107 is formed to have sufficient mechanical strength for physically supporting itself and each of the laser source 102 and the optical amplifying module 303.

Figure 4A:
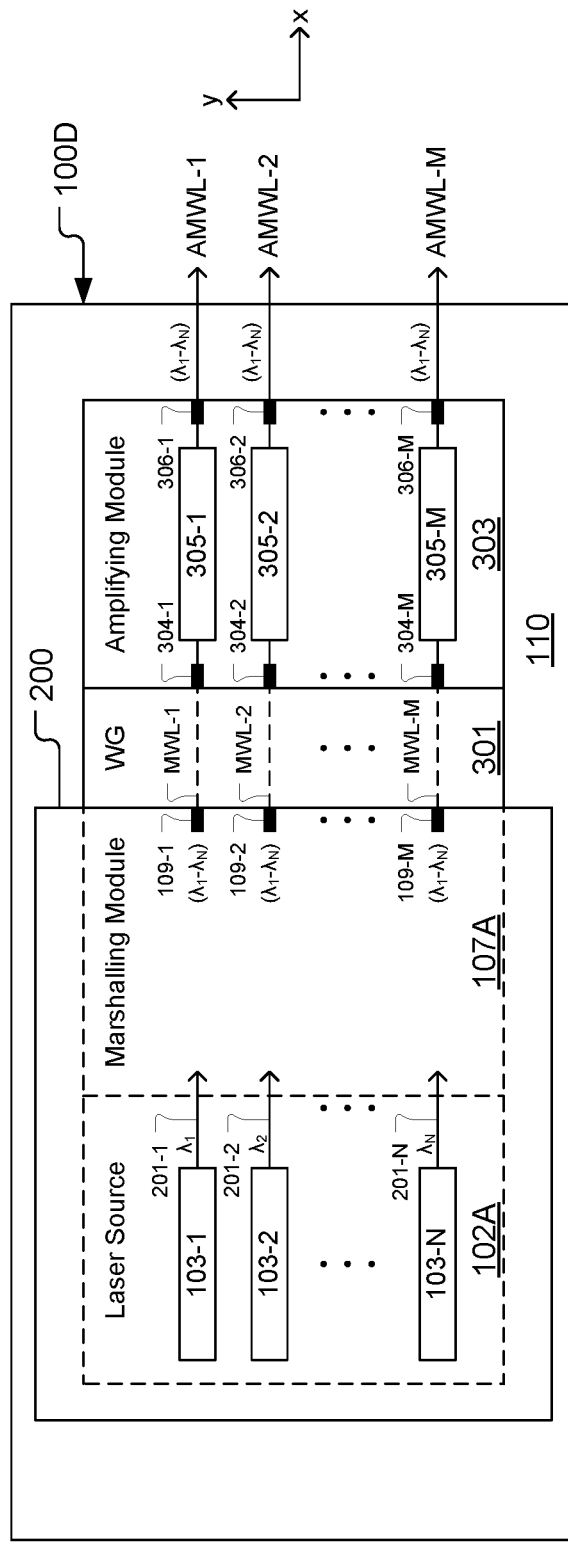
FIG. 4A shows an architectural diagram of a laser module, in accordance with some embodiments of the present invention.

FIG. 4A shows an architectural diagram of a laser module 100D, in accordance with some embodiments of the present invention. The laser module 100D includes the laser source 102A and the optical marshalling module 107A implemented within the same PLC 200, as described with regard to FIG. 2A. The laser module 100D also includes the optical waveguide 301 and the optical amplifying module 303, as described with regard to FIG. 3A. In some embodiments, the PLC 200, the optical waveguide 301, and the optical amplifying module 303 are disposed on the substrate 110. It should be understood that the laser module 100D is configured such that the plurality of multi-wavelength laser outputs MWL-1 to MWL-M are directed from the optical output ports 109-1 to 109-M of the optical marshalling module 107A within the PLC 200 into respective ones of the plurality of optical input ports 304-1 to 304-M of the optical amplifying module 303.

Figure 4B:
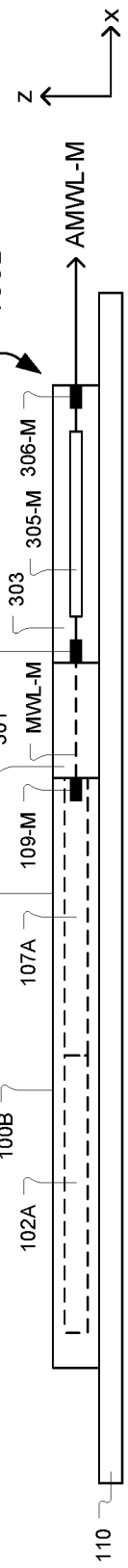
FIG. 4B shows a side view of the of the laser module configuration of FIG. 4A, in accordance with some embodiments of the present invention.

FIG. 4B shows a side view of the of the laser module 100D configuration of FIG. 4A, in accordance with some embodiments of the present invention. In the laser module 100D configuration of FIG. 4B, the PLC 200 and the optical amplifying module 303 are positioned in a substantially co-planar manner on the substrate 110 such that the optical output ports 109-1 to 109-M of the optical marshalling module 107A are horizontally aligned with the optical input ports 304-1 to 304-M, respectively, of the optical amplifying module 303, such that turning of the laser beams is not required at either the optical output ports 109-1 to 109-M of the optical marshalling module 107A or the optical input ports 304-1 to 304-M of the optical amplifying module 303.

Figure 4C:
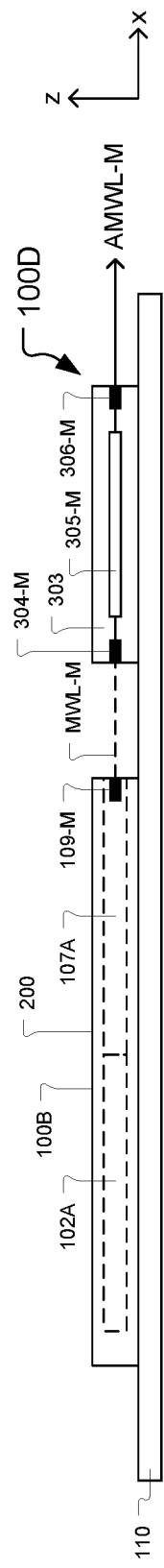
FIG. 4C shows a side view of the laser module configuration of FIG. 4B in which the optical waveguide is not present, in accordance with some embodiments of the present invention.
Figure 4D:
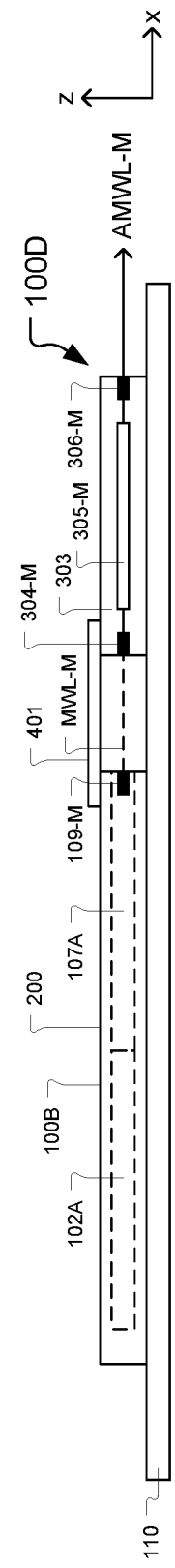
FIG. 4D shows a side view of the laser module configuration of FIG. 4C in which the empty space between the PLC and the optical amplifying module is covered and/or sealed by a member, in accordance with some embodiments of the present invention.

FIG. 4C shows a side view of the laser module 100D configuration of FIG. 4B in which the optical waveguide 301 is not present, in accordance with some embodiments of the present invention. In the embodiment of FIG. 4C, the PLC 200 and the optical amplifying module 303 are positioned in a substantially co-planar manner on the substrate 110 such that the optical output ports 109-1 to 109-M of the optical marshalling module 107A are horizontally aligned with the optical input ports 304-1 to 304-M, respectively, of the optical amplifying module 303, such that turning of the laser beams is not required at either the optical output ports 109-1 to 109-M of the optical marshalling module 107A or the optical input ports 304-1 to 304-M of the optical amplifying module 303. In the embodiment of FIG. 4C, an empty space is present between the optical output ports 109-1 to 109-M of the optical marshalling module 107A and the optical input ports 304-1 to 304-M of the optical amplifying module 303. Therefore, in the embodiment of FIG. 4C, the laser beams output from the PLC 200 travel along respective straight line paths through the empty space between the PLC 200 and the optical amplifying module 303. FIG. 4D shows a side view of the laser module 100D configuration of FIG. 4C in which the empty space between the PLC 200 and the optical amplifying module 303 is covered and/or sealed by a member 401, in accordance with some embodiments of the present invention. In various embodiments, the member 401 can be another chip placed during packaging, or can be another material placed during packaging, or can be an integral part of the PLC 200, or can be an integral part of the optical amplifying module 303.

Figure 4E:
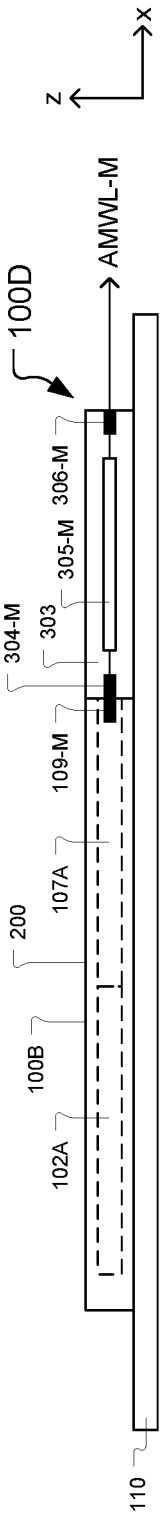
FIG. 4E shows a side view of the laser module in which the optical waveguide is not present and in which the PLC and the optical amplifying module are positioned in a side-by-side contacting manner, in accordance with some embodiments of the present invention.

FIG. 4E shows a side view of the laser module 100D in which the optical waveguide 301 is not present and in which the PLC 200 and the optical amplifying module 303 are positioned in a side-by-side contacting manner, in accordance with some embodiments of the present invention. In the embodiment of FIG. 4E, the PLC 200 and the optical amplifying module 303 are positioned in a substantially co-planar manner on the substrate 110 such that the optical output ports 109-1 to 109-M of the optical marshalling module 107A are horizontally aligned with the optical input ports 304-1 to 304-M, respectively, of the optical amplifying module 303, such that turning of the laser beams is not required at either the optical output ports 109-1 to 109-M of the optical marshalling module 107A or the optical input ports 304-1 to 304-M of the optical amplifying module 303.

FIG. 5A shows an architectural diagram of a laser module 100E in which an optical marshalling module 107B and an optical amplifying module 303A are implemented together within a same PLC 503, in accordance with some embodiments of the present invention. The optical marshalling module 107B is configured to function in essentially the same manner as the optical marshalling module 107 described above with regard to the laser module 100A. The optical amplifying module 303A is configured to function in essentially the same manner as the optical amplifying module 303 described above with regard to the laser module 100C. In the PLC 503, the optical marshalling module 107B and the optical amplifying module 303A are implemented in an integral manner with each other such that the plurality of multi-wavelength laser outputs MWL-1 to MWL-M provided by the optical marshalling module 107B are directed into the optical amplifying module 303A without having to travel through optical output ports and optical input ports, respectively, as indicated by lines 501-1 to 501-M. Also, in the PLC 503, the separate optical waveguide 301 is not needed due to the optical integration between the optical marshalling module 107B and the optical amplifying module 303A. In some embodiments of the laser module 100E, the laser source 102, the optical waveguide 105, and the PLC 503 are disposed on the substrate 110. It should be understood that the laser module 100E is configured such that the plurality of laser beams are directed from the optical output ports 104-1 to 104-N of the laser source 102 into respective ones of the plurality of optical input ports 108-1 to 108-N of the optical marshalling module 107B within the PLC 503.

FIG. 5B shows a side view of the laser module 100E configuration of FIG. 5A, in accordance with some embodiments of the present invention. In the laser module 100E configuration of FIG. 5B, the PLC 503 and the laser source 102 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107B, such that turning of the laser beams is not required at either the optical output ports 104-1 to 104-N of the laser source 102 or the optical input ports 108-1 to 108-N of the optical marshalling module 107B.

FIG. 5C shows a side view of the laser module 100E configuration of FIG. 5B in which the optical waveguide 105 is not present, in accordance with some embodiments of the present invention. In the embodiment of FIG. 5C, the PLC 503 and the laser source 102 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107B, such that turning of the laser beams is not required at either the optical output ports 104-1 to 104-N of the laser source 102 or the optical input ports 108-1 to 108-N of the optical marshalling module 107B. In the embodiment of FIG. 5C, an empty space is present between the optical output ports 104-1 to 104-N of the laser source 102 and the optical input ports 108-1 to 108-N of the optical marshalling module 107B. Therefore, in the embodiment of FIG. 5C, the laser beams output from the laser source 102 travel along respective straight line paths through the empty space between the laser source 102 and the PLC 503. FIG. 5D shows a side view of the laser module 100E configuration of FIG. 5C in which the empty space between the laser source 102 and the PLC 503 is covered and/or sealed by a member 505, in accordance with some embodiments of the present invention. In various embodiments, the member 505 can be another chip placed during packaging, or can be another material placed during packaging, or can be an integral part of the PLC 503, or can be an integral part of the laser source 102.

FIG. 5E shows a side view of the laser module 100E in which the optical waveguide 105 is not present and in which the laser source 102 and the PLC 503 are positioned in a side-by-side contacting manner, in accordance with some embodiments of the present invention. In the embodiment of FIG. 5E, the laser source 102 and the PLC 503 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107B, such that turning of the laser beams is not required at either the optical output ports 104-1 to 104-N of the laser source 102 or the optical input ports 108-1 to 108-N of the optical marshalling module 107B.

FIG. 6A shows an architectural diagram of a laser module 100F in which the laser source 102A, an optical marshalling module 107C, and the amplifying module 303A are implemented together within a same PLC 601, in accordance with some embodiments of the present invention. The laser source 102A is configured to function in essentially the same manner as the laser source 102 as described above with regard to the laser module 100A. The optical marshalling module 107C is configured to function in essentially the same manner as the optical marshalling module 107 described above with regard to the laser module 100A. The optical amplifying module 303A is configured to function in essentially the same manner as the optical amplifying module 303 described above with regard to the laser module 100C. In the PLC 601, the laser source 102A and the optical marshalling module 107C are implemented in an integral manner with each other such that laser beams 201-1 to 201-N generated by the plurality of lasers 103-1 to 103-N are directed into the optical marshalling module 107C without having to travel through optical output ports and optical input ports, respectively. Also, in the PLC 601, the separate optical waveguide 105 is not needed due to the optical integration between the laser source 102A and the optical marshalling module 107C. Also, in the PLC 601, the optical marshalling module 107C and the optical amplifying module 303A are implemented in an integral manner with each other such that the plurality of multi-wavelength laser outputs MWL-1 to MWL-M provided by the optical marshalling module 107C are directed into the optical amplifying module 303A without having to travel through optical output ports and optical input ports, respectively, as indicated by lines 501-1 to 501-M. Also, in the PLC 601, the separate optical waveguide 301 is not needed due to the optical integration between the optical marshalling module 107C and the optical amplifying module 303A. FIG. 6B shows a side view of the laser module 100F configuration of FIG. 6A, in accordance with some embodiments of the present invention.

It should be understood that the geometric depictions of each of the laser source 102/102A, the optical waveguides 105/301, the optical marshalling modules 107/107A/107B/107C, and the optical amplifying modules 303/303A as disclosed herein are provided by way of example for ease of description of the present invention. In various embodiments, each of the laser source 102/102A, the optical waveguides 105/301, the optical marshalling modules 107/107A/107B/107C, and the optical amplifying modules 303/303A can have essentially any geometric shape as necessary to form an optical-electronic device of a desired shape and size. In some embodiments, one or more of the laser source 102/102A, the optical waveguides 105/301, the optical marshalling modules 107/107A/107B/107C, and the optical amplifying modules 303/303A can be configured to have a substantially planar geometric shape. In some embodiments, one or more of the laser source 102/102A, the optical waveguides 105/301, the optical marshalling modules 107/107A/107B/107C, and the optical amplifying modules 303/303A can be configured to have a three-dimensionally varying geometric shape, i.e., a shape that is other than a simple rectangular prism. Also, it should be understood that in various embodiments each of the laser source 102/102A, the optical waveguides 105/301, the optical marshalling modules 107/107A/107B/107C, and the optical amplifying modules 303/303A can have different sizes as measured in any reference direction of a related coordinate system, i.e., in any of the x-direction, y-direction, and z-direction of the Cartesian coordinate system.

Figure 7:
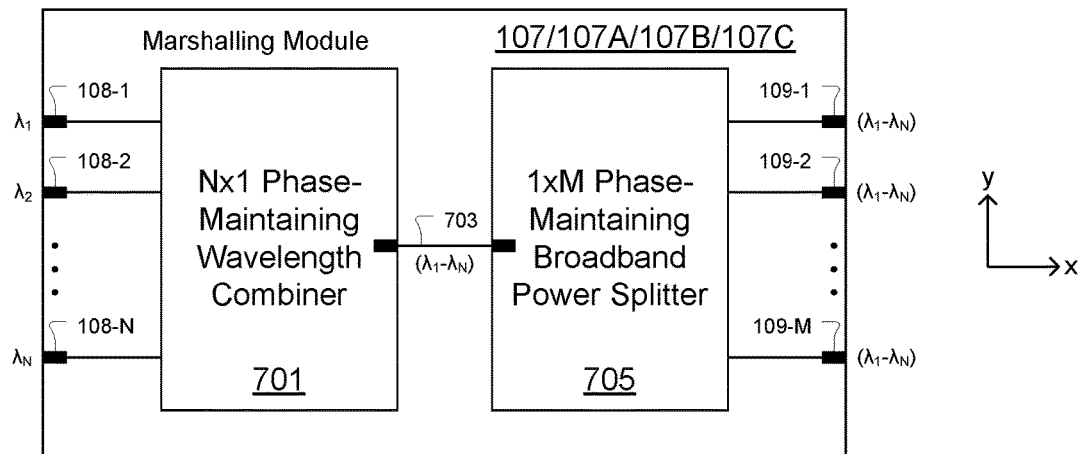
FIG. 7 shows an example implementation of the optical marshalling module that includes an N×1 (phase-maintaining) wavelength combiner and a 1×M (phase-maintaining) broadband power splitter, in accordance with some embodiments of the present invention.

FIG. 7 shows an example implementation of the optical marshalling module 107/107A/107B/107C that includes an N×1 (polarization-maintaining) wavelength combiner 701 and a 1×M (polarization-maintaining) broadband power splitter 705, in accordance with some embodiments of the present invention. The wavelength combiner 701 is configured to combine the plurality of laser beams received at the optical input ports 108-1 to 108-N into a multi-wavelength laser beam which is transmitted through an optical waveguide 703 from the wavelength combiner 701 to the broadband power splitter 705. The broadband power splitter 705 is configured to distribute portions of a total power of the multi-wavelength laser beam to each of the plurality of optical output ports 109-1 to 109-M of the optical marshalling module 107/107A/107B/107C.

Figure 8:
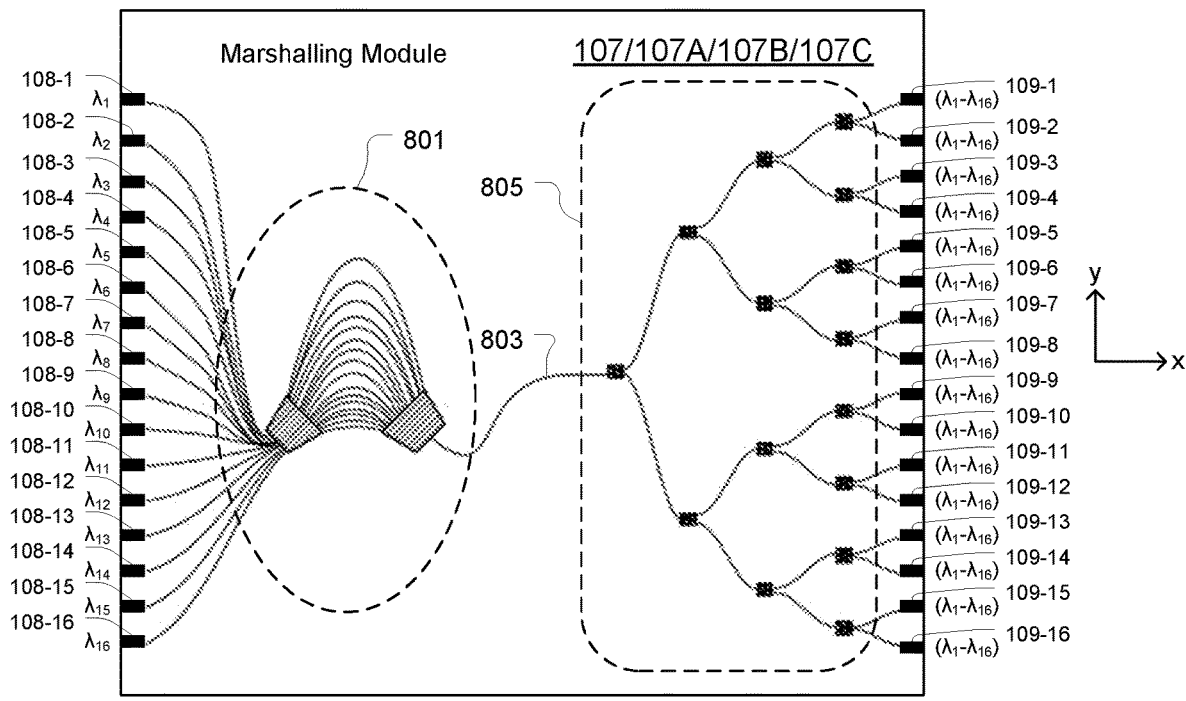
FIG. 8 shows an example implementation of the optical marshalling module that includes an arrayed waveguide and a broadband power splitter, in accordance with some embodiments of the present invention.

FIG. 8 shows an example implementation of the optical marshalling module 107/107A/107B/107C that includes an arrayed waveguide 801 and a broadband power splitter 805, in accordance with some embodiments of the present invention. In the example of FIG. 8, the arrayed waveguide 801 is a 16-to-1 arrayed waveguide. However, it should be understood that in various embodiments the arrayed waveguide 801 can be configured to receive any number (N) of optical inputs. Also, in the example of FIG. 8, the broadband power splitter 805 is a 1-to-16 broadband power splitter. However, it should be understood that in various embodiments the broadband power splitter 805 can be configured to output any number (M) of optical outputs. The arrayed waveguide 801 is configured to combine the plurality of laser beams received at the optical input ports 108-1 to 108-16 into a multi-wavelength laser beam which is transmitted through an optical waveguide 803 from the arrayed waveguide 801 to the broadband power splitter 805. The broadband power splitter 805 is configured to distribute portions of a total power of the multi-wavelength laser beam to each of the plurality of optical output ports 109-1 to 109-16 of the optical marshalling module 107/107A/107B/107C.

Figure 9:
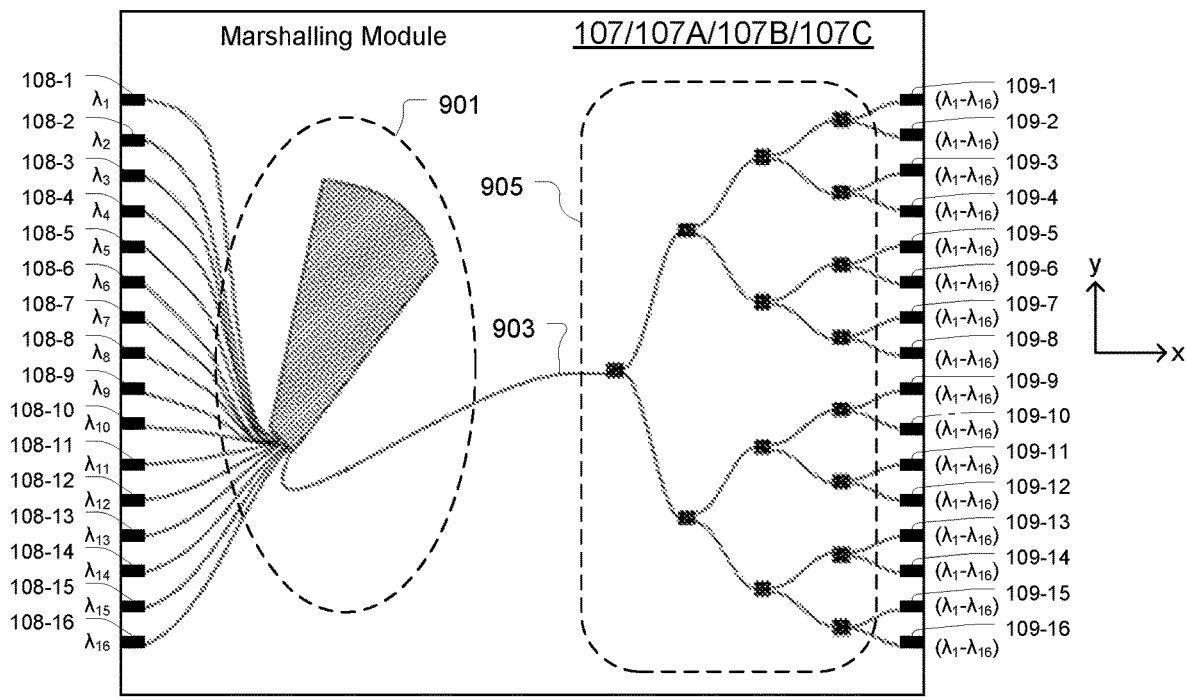
FIG. 9 shows an example implementation of the optical marshalling module that includes an Echelle grating and a broadband power splitter, in accordance with some embodiments of the present invention.

FIG. 9 shows an example implementation of the optical marshalling module 107/107A/107B/107C that includes an Echelle grating 901 and a broadband power splitter 905, in accordance with some embodiments of the present invention. In the example of FIG. 8, the Echelle grating 901 is a 16-to-1 grating. However, it should be understood that in various embodiments the Echelle grating 901 can be configured to receive any number (N) of optical inputs. Also, in the example of FIG. 9, the broadband power splitter 905 is a 1-to-16 broadband power splitter. However, it should be understood that in various embodiments the broadband power splitter 905 can be configured to output any number (M) of optical outputs. The Echelle grating 901 is configured to combine the plurality of laser beams received at the optical input ports 108-1 to 108-16 into a multi-wavelength laser beam which is transmitted through an optical waveguide 903 from the Echelle grating 901 to the broadband power splitter 905. The broadband power splitter 905 is configured to distribute portions of a total power of the multi-wavelength laser beam to each of the plurality of optical output ports 109-1 to 109-16 of the optical marshalling module 107/107A/107B/107C.

Figure 10:
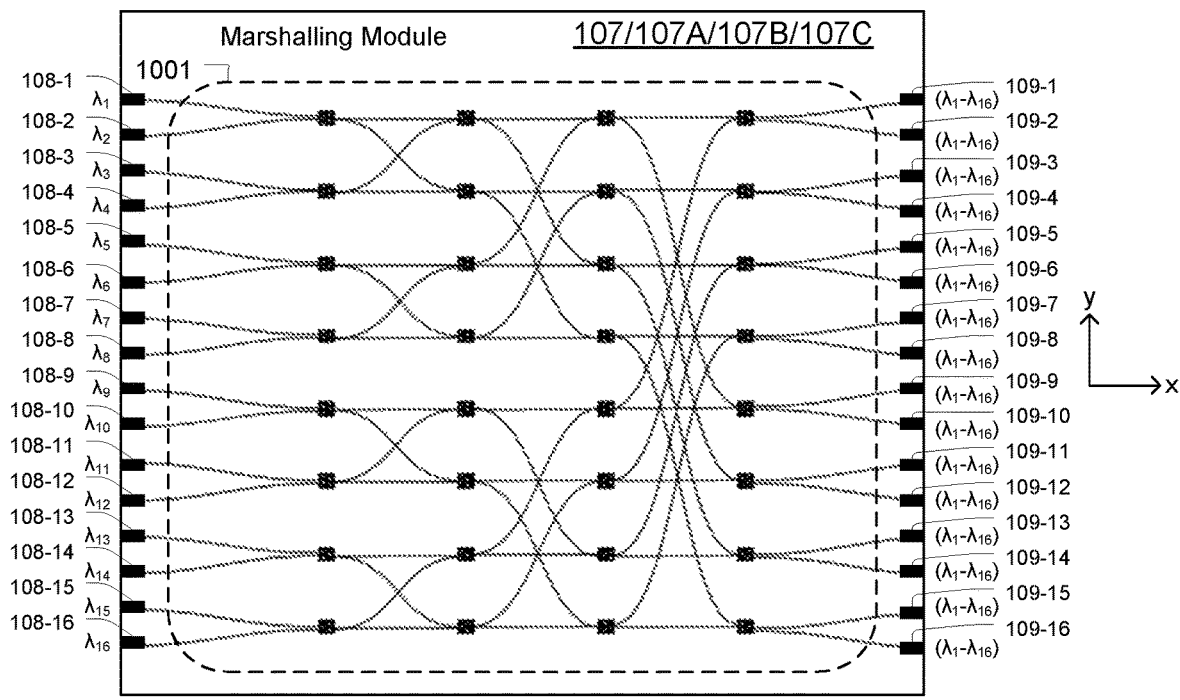
FIG. 10 shows an example implementation of the optical marshalling module that includes a butterfly waveguide network, in accordance with some embodiments of the present invention.

FIG. 10 shows an example implementation of the optical marshalling module 107/107A/107B/107C that includes a butterfly waveguide network 1001, in accordance with some embodiments of the present invention. In the example of FIG. 10, the butterfly waveguide network 1001 is a 16 input-to-16 output network. However, it should be understood that in various embodiments the butterfly waveguide network 1001 can be configured to receive any number (N) of optical inputs and provide any number (M) of optical outputs. The butterfly waveguide network 1001 is configured to receive the (N) laser beams from the optical input ports 108-1 to 108-N and distribute portions of each of the (N) laser beams to each of the (M) optical output ports of the optical marshalling module 107/107A/107B/107C.

Figure 11:
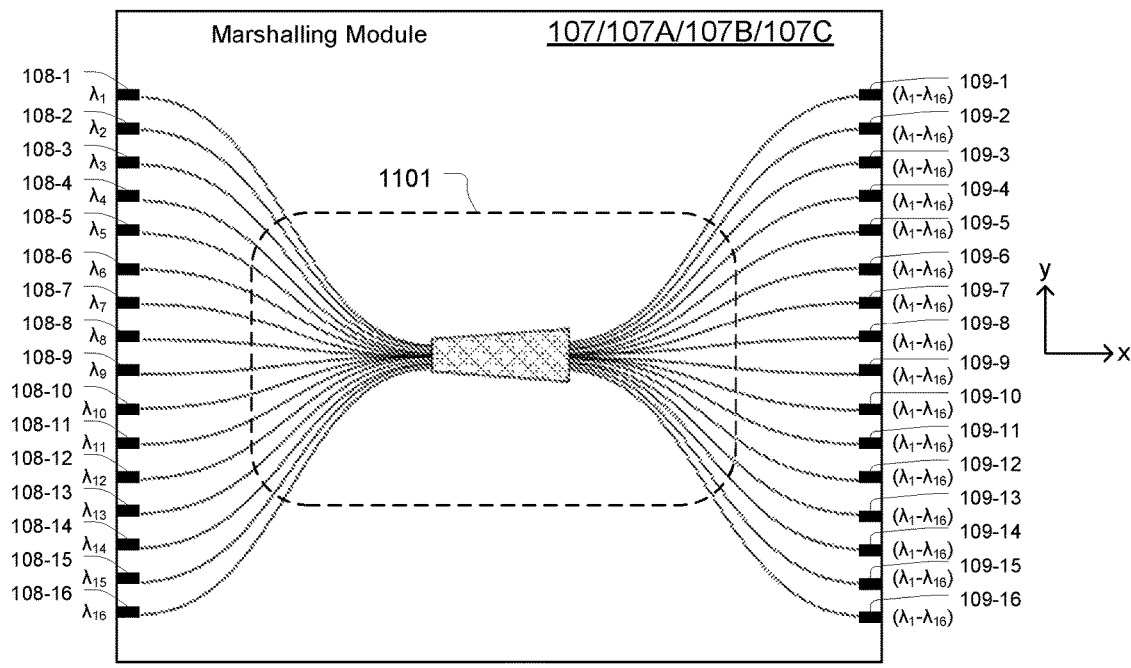
FIG. 11 shows an example implementation of the optical marshalling module that includes a star coupler, in accordance with some embodiments of the present invention.

FIG. 11 shows an example implementation of the optical marshalling module 107/107A/107B/107C that includes a star coupler 1101, in accordance with some embodiments of the present invention. In the example of FIG. 11, the star coupler 1101 is a 16 input-to-16 output star coupler. However, it should be understood that in various embodiments the star coupler 1101 can be configured to receive any number (N) of optical inputs and provide any number (M) of optical outputs. The star coupler 1101 is configured to receive the (N) laser beams from the optical input ports 108-1 to 108-N and distribute portions of each of the (N) laser beams to each of the (M) optical output ports of the optical marshalling module 107/107A/107B/107C.

Figure 12A:
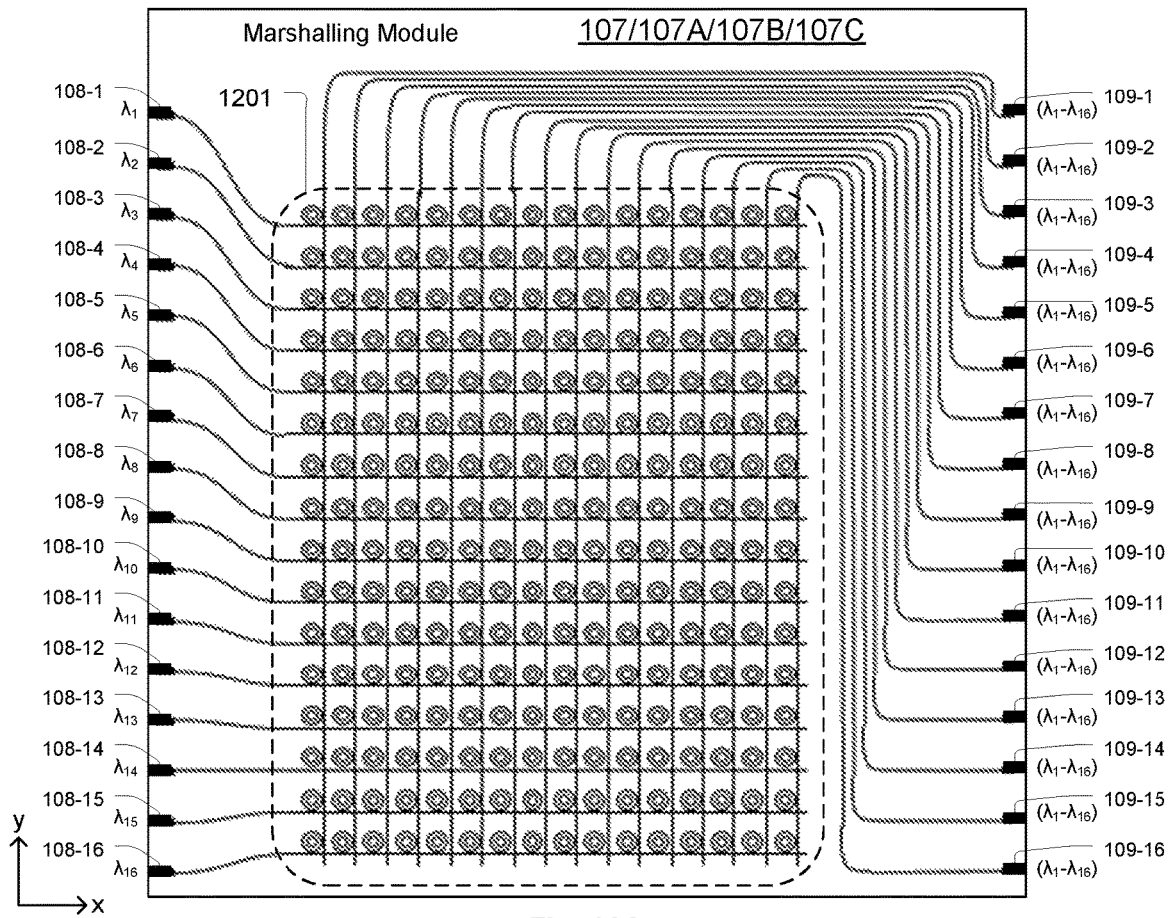
FIG. 12A shows an example implementation of the optical marshalling module that includes a resonator ring array, in accordance with some embodiments of the present invention.

FIG. 12A shows an example implementation of the optical marshalling module 107/107A/107B/107C that includes a resonator ring array 1201, in accordance with some embodiments of the present invention. In the example of FIG. 12A, the resonator ring array 1201 is a 16 input-to-16 output resonator ring array. However, it should be understood that in various embodiments the resonator ring array 1201 can be configured to receive any number (N) of optical inputs and provide any number (M) of optical outputs. The resonator ring array 1201 is configured to receive the (N) laser beams from the optical input ports 108-1 to 108-N and distribute portions of each of the (N) laser beams to each of the (M) optical output ports of the optical marshalling module 107/107A/107B/107C.

Figure 12B:
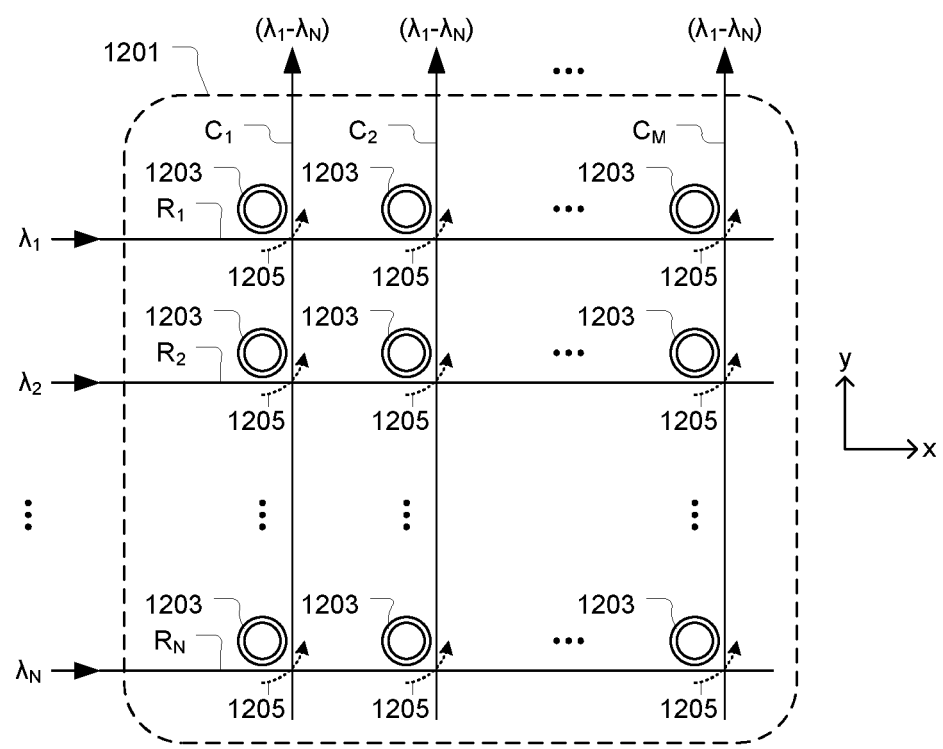
FIG. 12B shows a detailed diagram of the resonator ring array, in accordance with some embodiments of the present invention.

FIG. 12B shows a detailed diagram of the resonator ring array 1201, in accordance with some embodiments of the present invention. The resonator ring array 1201 includes a number of resonator ring rows $R_1$ to $R_N$ equal to a number (N) of the plurality of laser beams respectively received at the (N) optical input ports 108-1 to 108-N. Each resonator ring row $R_1$ to $R_N$ includes a number of resonator rings 1203 equal to a number (M) of the plurality of optical output ports 109-1 to 109-M of the optical marshalling module 107/107A/107B/107C. Each of the resonator ring rows $R_1$ to $R_N$ is configured to receive a different one of the plurality of laser beams as a corresponding input laser beam. Therefore, each of the resonator ring rows $R_1$ to $R_N$ receives a different one of the wavelengths ($\lambda_1$-$\lambda_N$) of the (N) laser beams provided by the laser source 102/102A. And, for this reason, each resonator ring 1203 of a given one of the resonator ring rows $R_1$ to $R_N$ can be optimized for operation with the particular laser beam wavelength that the given resonator ring row is to receive. And, correspondingly, the resonator rings 1203 of different resonator ring rows $R_1$ to $R_N$ can be optimized for operation with different laser beam wavelengths. Each resonator ring 1203 in a given resonator ring row $R_1$ to $R_N$ is configured to redirect a portion of the corresponding input laser beam of the given resonator ring row to a different one of the plurality of optical output ports 109-1 to 109-M of the optical marshalling module 107/107A/107B/107C, as indicated by arrows 1205. In some embodiments, the resonator rings 1203 of a given resonator ring row $R_1$ to $R_N$ are positioned to receive the corresponding input laser beam of the given resonator ring row in a successive manner, where successively positioned resonator rings 1203 of the given resonator ring row relative to the laser source 102/102A are configured to progressively redirect larger portions of the corresponding input laser beam of the given resonator ring row. In this manner, the resonator rings 1203 of a given resonator ring row $R_1$ to $R_N$ can provide a substantially equal amount of laser light to each of the optical output ports 109-1 to 109-M of the optical marshalling module 107/107A/107B/107C.

Figure 13:
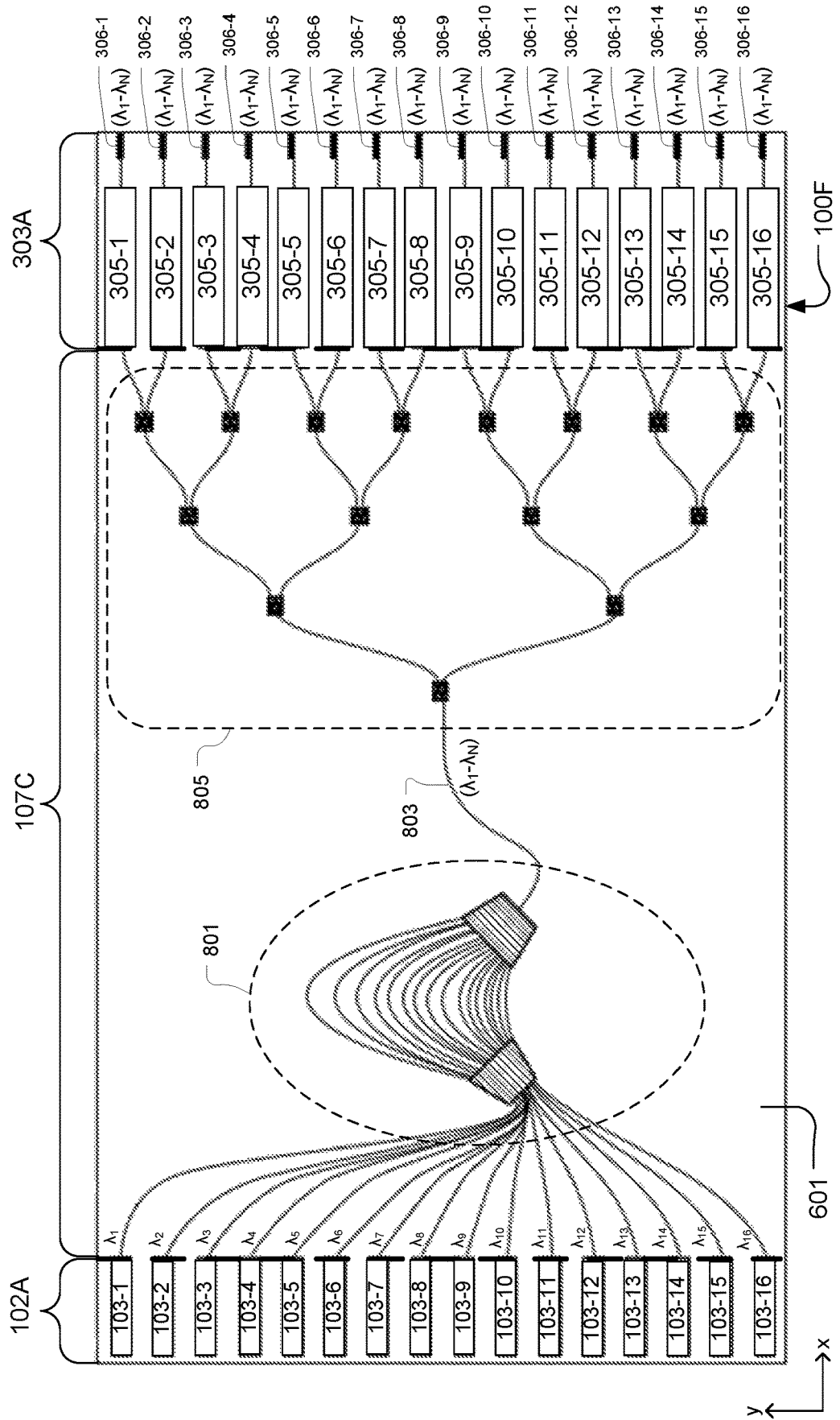
FIG. 13 shows an example implementation of the laser module on the PLC in which the marshalling module is implemented to include the arrayed waveguide and the broadband power splitter, in accordance with some embodiments of the present invention.
Figure 14:
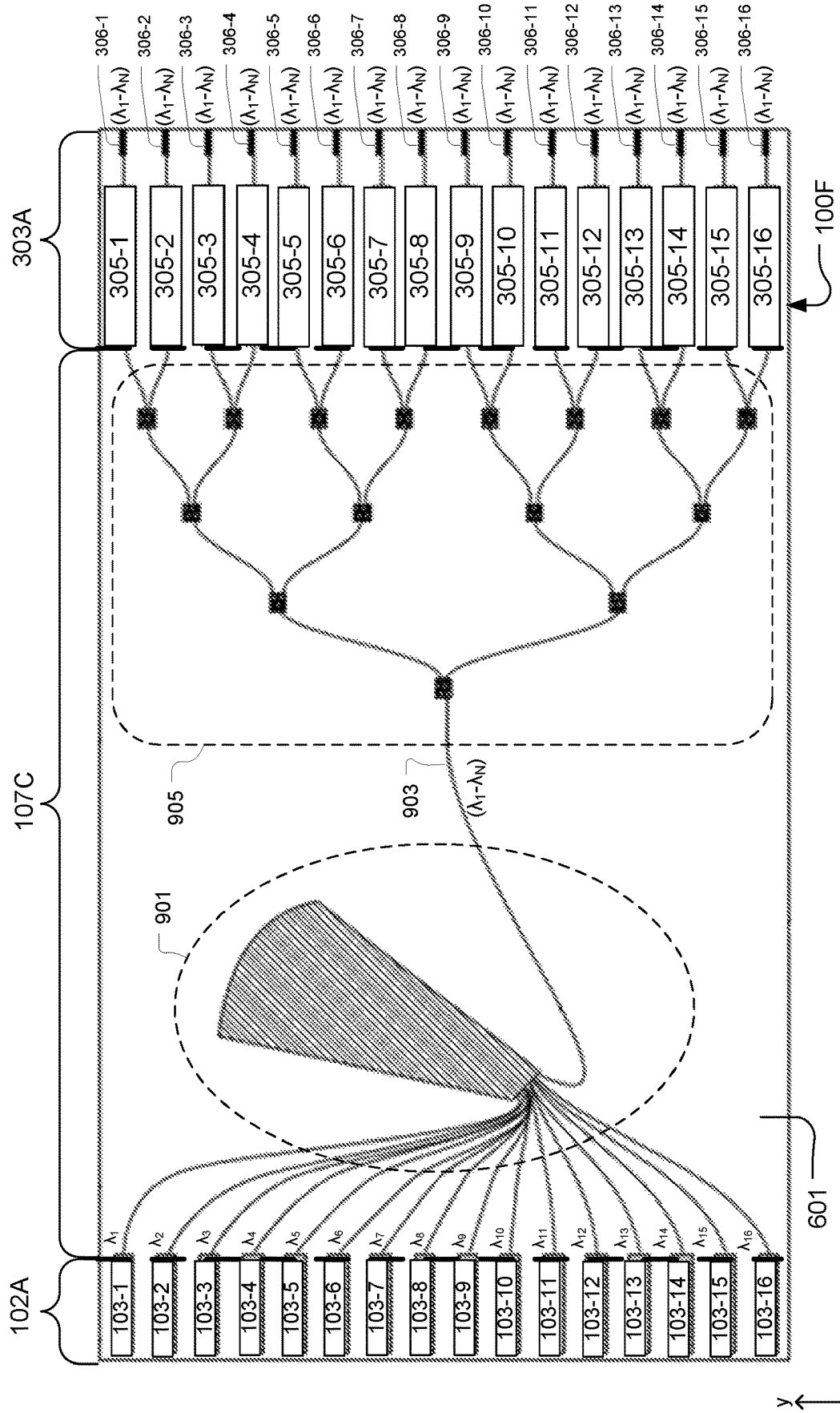
FIG. 14 shows an example implementation of the laser module on the PLC in which the marshalling module is implemented to include the Echelle grating and the broadband power splitter, in accordance with some embodiments of the present invention.
Figure 15:
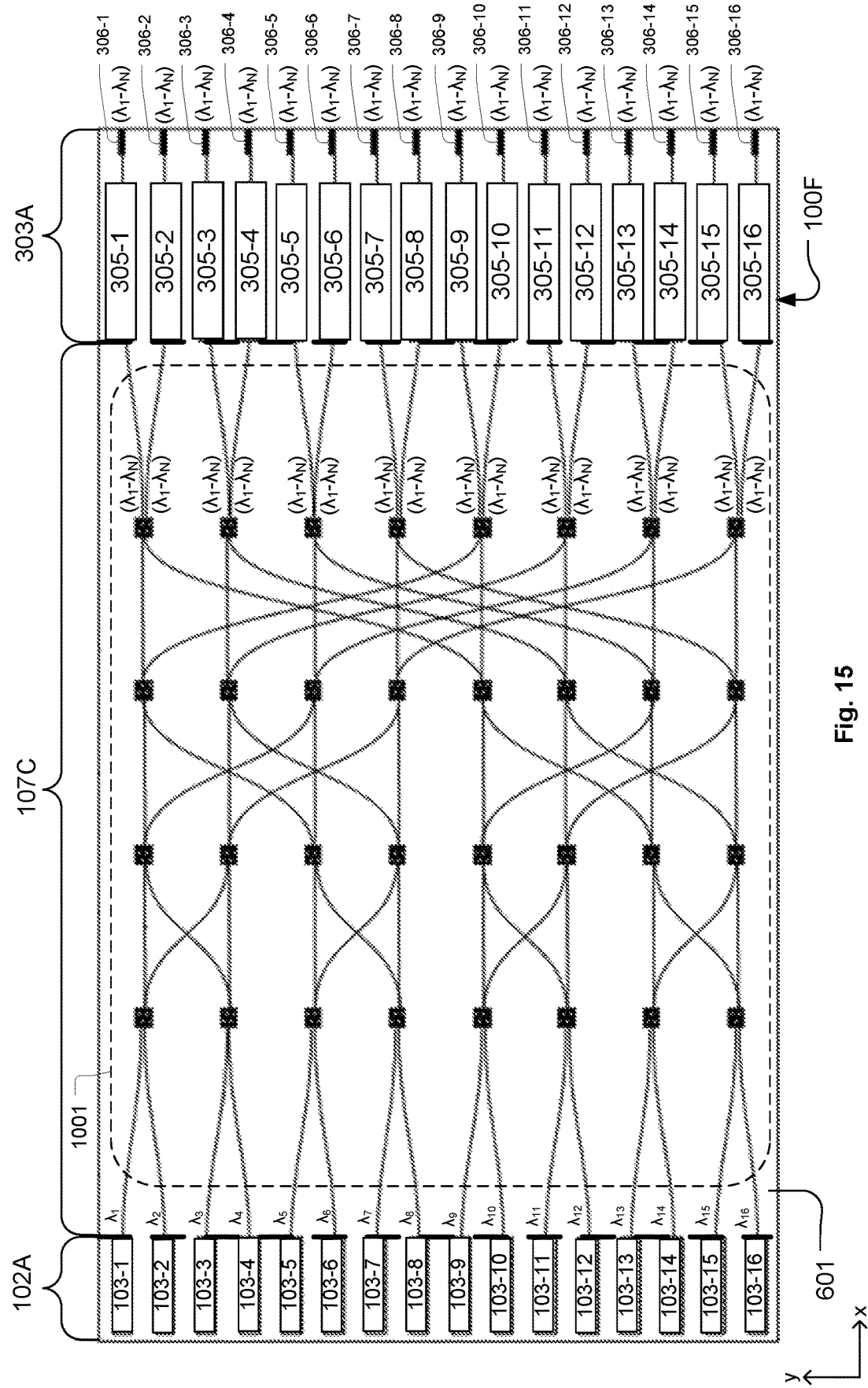
FIG. 15 shows an example implementation of the laser module on the PLC in which the marshalling module is implemented to include the butterfly waveguide network, in accordance with some embodiments of the present invention.
Figure 16:
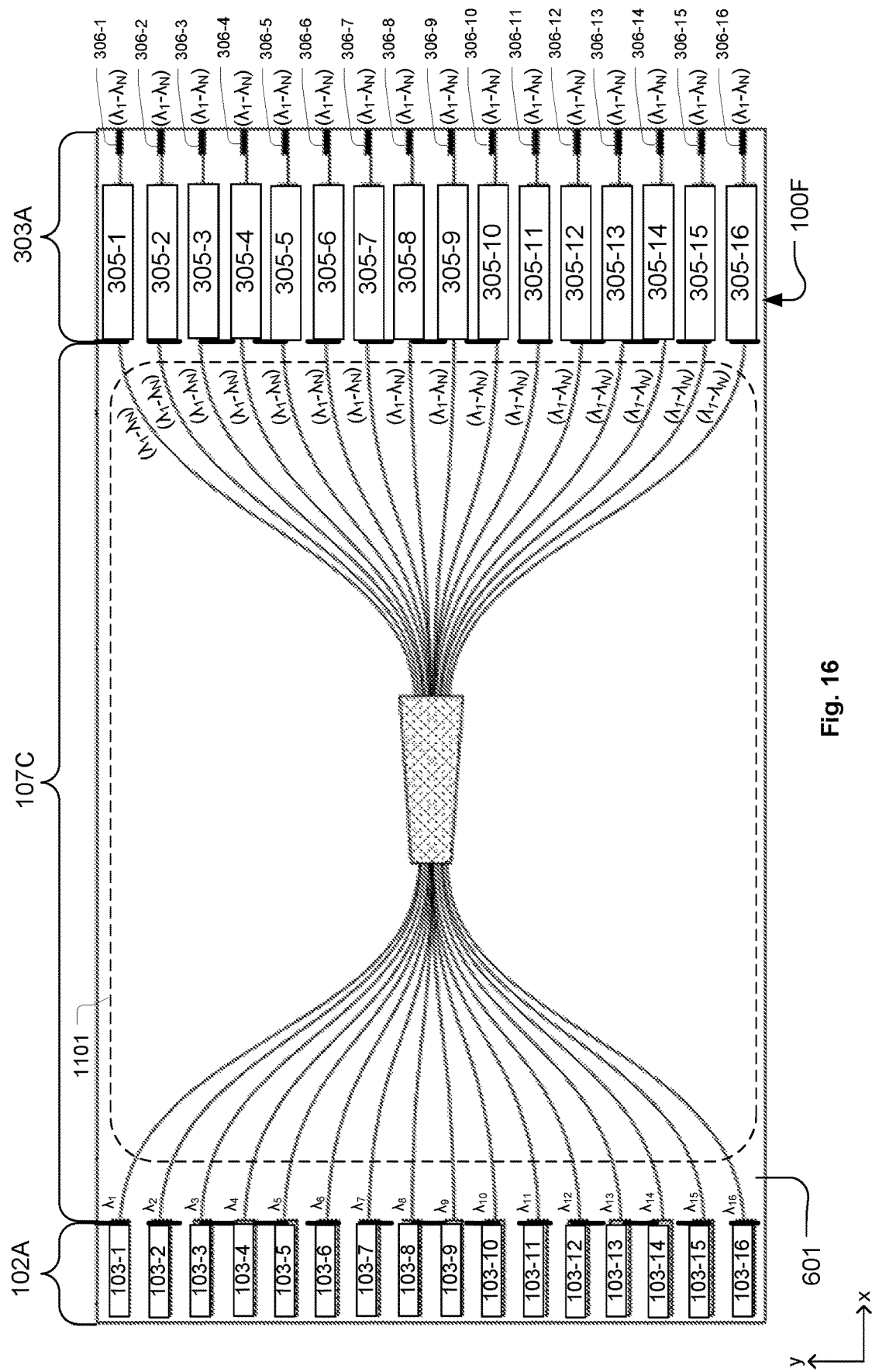
FIG. 16 shows an example implementation of the laser module on the PLC in which the marshalling module is implemented to include the star coupler, in accordance with some embodiments of the present invention.

FIG. 13 shows an example implementation of the laser module 100F on the PLC 601 in which the marshalling module 107C is implemented to include the arrayed waveguide 801 and the broadband power splitter 805, in accordance with some embodiments of the present invention. FIG. 14 shows an example implementation of the laser module 100F on the PLC 601 in which the marshalling module 107C is implemented to include the Echelle grating 901 and the broadband power splitter 905, in accordance with some embodiments of the present invention. FIG. 15 shows an example implementation of the laser module 100F on the PLC 601 in which the marshalling module 107C is implemented to include the butterfly waveguide network 1001, in accordance with some embodiments of the present invention. FIG. 16 shows an example implementation of the laser module 100F on the PLC 601 in which the marshalling module 107C is implemented to include the star coupler 1101, in accordance with some embodiments of the present invention.

Figure 17:
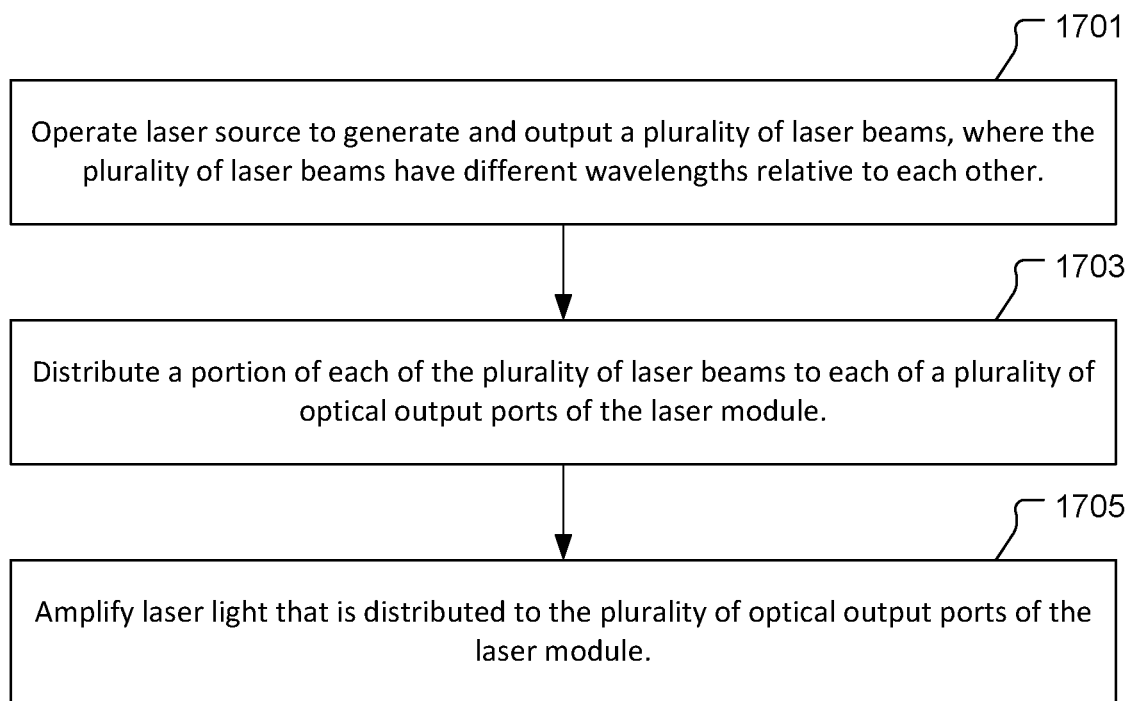
FIG. 17 shows a flowchart of a method for operating a laser module, in accordance with some embodiments of the present invention.

FIG. 17 shows a flowchart of a method for operating a laser module 100A-100F, in accordance with some embodiments of the present invention. The method includes an operation 1701 for operating a laser source to generate and output a plurality of laser beams, where the plurality of laser beams have different wavelengths relative to each other. The different wavelengths of the plurality of laser beams are distinguishable to an optical data communication system. The method also includes an operation 1703 for distributing a portion of each of the plurality of laser beams to each of a plurality of optical output ports of the laser module 100A-100F. The operation 1703 is performed such that all of the different wavelengths of the plurality of laser beams are provided to each of the plurality of optical output ports of the laser module 100A-100F. In some embodiments, the method optionally includes an operation 1705 for amplifying laser light that is distributed to the plurality of optical output ports of the laser module 100A-100F. In some embodiments, the operation 1701 is performed by the laser source 102/102A, and the operation 1703 is performed by the optical marshalling module 107/107A/107B/107C, and the operation 1705 is performed by the optical amplifying module 303/303A. In some embodiments, any two or more of the laser source 102/102A and the optical marshalling module 107/107A/107B/107C and the optical amplifying module 303/303A are operated as physically separate components. Also, in some embodiments, any two or more of the laser source 102/102A and the optical marshalling module 107/107A/107B/107C and the optical amplifying module 303/303A are disposed on a common substrate 110 and/or in a same PLC.

In some embodiments, the method includes directing the plurality of laser beams from the laser source 102/102A into the optical marshalling module 107/107A/107B/107C. In some embodiments, the plurality of laser beams are directed from the laser source 102/102A through an empty space and from the empty space into the optical marshalling module 107/107A/107B/107C. In some embodiments, the method includes transmitting the plurality of laser beams through the optical waveguide 105 in order to direct the plurality of laser beams from the laser source 102/102A into the optical marshalling module 107/107A/107B/107C. In some embodiments, the method includes transmitting the plurality of laser beams through one or more optical vertical coupling device(s) in order to direct the plurality of laser beams from the laser source 102/102A into the optical marshalling module 107/107A/107B/107C. In some embodiments, the method includes maintaining a polarization of the plurality of laser beams as the portions thereof are distributed to each of the plurality of optical output ports of the laser module 100A-100F.

In some embodiments, each of the plurality of laser beams is generated using a respective distributed feedback laser. In some embodiments, the method includes controlling temperatures of the different distributed feedback lasers so as to provide substantial uniformity in temperature-dependent wavelength drift among the different distributed feedback lasers. Also, in some embodiments, the method includes controlling distribution of the portion of each of the plurality of laser beams to each of the plurality of optical output ports of the laser module 100A-100F such that each of the plurality of optical output ports receives a similar amount of optical power of any given one of the plurality of laser beams within a specified factor. In some embodiments, the specified factor is a factor of five. In some embodiments, the specified factor is a factor one, two, three, four, six, or another factor between any of these factors.

It should be further understood, that the present invention also includes methods for manufacturing each of the laser modules 100A-100F as disclosed herein. And, these methods for manufacturing laser modules 100A-100F can include essentially any known established processes and/or techniques for manufacturing semiconductor devices and for manufacturing components/substrates for interfacing with one or more semiconductor devices.

In some embodiments, a laser module 100A-100F is designed to supply laser light having of one or more wavelengths. The laser module 100A-100F can be organized into a number of main components, including:

- a laser source 102/102A, including multiple lasers, e.g., laser diodes, which each produces a subset of the wavelengths output by the laser source 102/102A;
- an optical marshalling module 107/107A/107B/107C that provides a combiner, coupler, and/or splitter network (CCSN), whose inputs are the output wavelengths from the laser source 102/102A;
- an optical amplifier module 303/303A including multiple optical amplifiers which operate to increase the amount of optical power output by the laser module 100A-100F, potentially at a cost of signal-to-noise ratio;
- a fiber coupling array connected to bringing light out of the laser module 100A-100F;
- optical waveguides 105, 301 (that can include couplers, reflective surfaces, and/or lenses) for directing, collimating, and/or coupling light to/from the optical marshalling module 107/107A/107B/107C, from the laser source 102/102A, to/from the fiber coupling array, and to/from the optical amplifier module 303/303A;
- a thermal spreader component, e.g., a thermally-conductive substrate, that thermally links together all of the lasers within the laser source 102/102A (such as copper attaching all the laser diodes together), so that temperature differences between laser diodes are minimized—where, in some embodiments, the thermal spreader component can be the same substrate 110 on which the laser source 102/102A, the optical marshalling module 107/107A/107B/107C, and the optical amplifier module 303/303A are constructed and/or attached.

In various embodiments, the optical marshalling module 107/107A/107B/107C can be constructed in several ways, including using discrete components or as an integrated device, such as a planar lightwave circuit (PLC). Various embodiments of the optical marshalling module 107/107A/107B/107C can include the following features:

- A PLC implementation that provides the advantage that polarization is maintained for light propagating through the optical marshalling module 107/107A/107B/107C.
- A PLC implementation wherein the laser source 102/102A and/or the optical amplifier module 303/303A can be constructed using the same substrate as the optical marshalling module 107/107A/107B/107C—where the substrate of the optical marshalling module 107/107A/107B/107C supports the construction of the laser source 102/102A (such as specific III-V or group IV substrates).
- A PLC implementation wherein the laser source 102/102A and/or the optical amplifier module 303/303A can be attached to the optical marshalling module 107/107A/107B/107C, such as by flip-chip bonding.
- A PLC implementation in which the laser source 102/102A can couple light to and from the structures in the PLC—where the optical marshalling module 107/107A/107B/107C can provide the lasing cavity of the laser source 102/102A and/or one or more optical waveguide(s) from which the output laser light couples into/through coupling devices.
- A PLC implementation in which the optical amplifying module 303/303A can couple light to and from the structures in the PLC—where the optical marshalling module 107/107A/107B/107C can provide one or more optical waveguide(s) from which the input and output light of the optical amplifiers couple to and from the amplifier, such as through appropriate coupling devices including grating couplers, edge couplers, and/or evanescently coupled waveguides, among others.

In some embodiments, a glass substrate may not have sufficient thermal conductivity to provide thermal coupling for the laser source 102/102A. In such embodiments, a silicon substrate (such as using silicon photonics) can be used to provide thermal conductivity, provided that a low-index cladding material (buried oxide or deep trench layer) is also thermally conductive or is not too thick. Alternatively, III-V substrates such as GaAs or InP also have high thermal conductivity and can similarly serve as an appropriate material for thermal coupling for the laser source 102/102A.

In various embodiments, there are multiple possible configurations for the optical marshalling module 107/107A/107B/107C, including the following, among others:

- The optical marshalling module 107/107A/107B/107C can be constructed as a fan-in, fan-out N-to-N symmetric star coupler, which both combines N wavelengths and splits the power N ways.
- The optical marshalling module 107/107A/107B/107C can be constructed as a fan-in, fan-out N-to-M asymmetric star coupler, which both combines N wavelengths and splits the power M ways.
- The optical marshalling module 107/107A/107B/107C can be constructed as an N-to-N star coupler using $N/2*\log_2 N$ of 2×2 splitters/couplers. Such a configuration has sum from n=1 to $\log_2 N-1$ of $(2^i-1)$ waveguide crossings in the most straightforward implementation.
- The optical marshalling module 107/107A/107B/107C can be constructed as a 1-to-N splitter, used in the reverse direction. This configuration outputs $1/2^N$ of the total input laser power and drops the rest.
- The optical marshalling module 107/107A/107B/107C can be constructed as an Arrayed Waveguide (AWG) plus a splitter.

In some embodiments, the optical amplifier module 303/303A is used to increase the output power of the laser module 100C-100F. In some embodiments, the optical amplifier module 303/303A can include the following features:

Optical amplifiers can take multiple forms, such as semiconductor optical amplifiers, erbium/ytterbium-doped fiber amplifiers, raman amplifiers, among others.

Optical amplifiers can be used to amplify input light of only a single wavelength or of a plurality of wavelengths.

When amplifying a plurality of wavelengths, each optical amplifier can have sufficient optical bandwidth to amplify all the input wavelengths.

If the wavelengths are broadband enough to exceed the bandwidth of an individual optical amplifier, multiple optical amplifiers can be used to amplify all wavelengths, with each optical amplifier amplifying only the subset of wavelengths falling under its amplification bandwidth. In this scenario, the optical amplifiers can be added to intermediate points within the optical marshalling module 107/107A/107B/107C, with the input to each optical amplifier defined to have the subset of wavelengths that the optical amplifier amplifies.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A laser module, comprising:
a plurality of lasers configured to respectively generate and output a plurality of laser beams, the plurality of laser beams having different wavelengths relative to each other, the different wavelengths distinguishable to an optical data communication system; and
an optical marshalling module configured to receive the plurality of laser beams as respectively generated and output by the plurality of lasers, the optical marshalling module configured to distribute a portion of each of the plurality of laser beams as respectively generated and output by the plurality of lasers to each of a plurality of optical output ports of the optical marshalling module, such that all of the different wavelengths of the plurality of laser beams are provided to each of the plurality of optical output ports of the optical marshalling module, wherein the optical marshalling module is a passive component,
wherein the optical marshalling module includes either a star coupler or a butterfly waveguide network or a combination of a wavelength combiner and a broadband power splitter,
wherein the star coupler is configured to receive the plurality of laser beams and distribute portions of each of the plurality of laser beams to each of the plurality of optical output ports of the optical marshalling module,
wherein the butterfly waveguide network is configured to receive the plurality of laser beams and distribute portions of each of the plurality of laser beams to each of the plurality of optical output ports of the optical marshalling module,
wherein the wavelength combiner is configured to combine the plurality of laser beams into a multi-wavelength laser beam, and the broadband power splitter is configured to distribute portions of a total power of the multi-wavelength laser beam to each of the plurality of optical output ports of the optical marshalling module.

2. The laser module as recited in claim 1, wherein the optical marshalling module is physically separate from the plurality of lasers.

3. The laser module as recited in claim 2, wherein the plurality of lasers is aligned with the optical marshalling module to direct the plurality of laser beams into a respective plurality of optical input ports of the optical marshalling module.

4. The laser module as recited in claim 3, wherein the optical marshalling module is positioned spaced apart from the plurality of lasers.

5. The laser module as recited in claim 3, wherein the optical marshalling module is positioned in contact with the plurality of lasers.

6. The laser module as recited in claim 3, wherein a portion of the optical marshalling module is positioned to overlap a portion of a laser source that includes the plurality of lasers.

7. The laser module as recited in claim 3, further comprising:
an optical waveguide positioned between the plurality of lasers and the optical marshalling module, the optical waveguide configured to direct the plurality of laser beams from the plurality of lasers into respective ones of the plurality of optical input ports of the optical marshalling module.

8. The laser module as recited in claim 7, wherein the optical waveguide is configured to maintain a polarization of the plurality of laser beams between the plurality of lasers and the optical marshalling module.

9. The laser module as recited in claim 3, wherein the optical marshalling module is configured to maintain a polarization of each of the plurality of laser beams between the plurality of optical input ports of the optical marshalling module and the plurality of optical output ports of the optical marshalling module.

10. The laser module as recited in claim 1, wherein the plurality of lasers and the optical marshalling module are implemented together within a planar lightwave circuit.

11. The laser module as recited in claim 1, wherein each of the plurality of lasers is a distributed feedback laser.

12. The laser module as recited in claim 1, further comprising:
a thermal spreader component disposed proximate to the plurality of lasers, the thermal spreader component configured to spread a thermal output of the plurality of lasers to provide substantial uniformity in temperature-dependent wavelength drift among the plurality of lasers.

13. The laser module as recited in claim 12, wherein the optical marshalling module includes the thermal spreader component.

14. The laser module as recited in claim 1, wherein the optical marshalling module is configured such that each of the plurality of optical output ports of the optical marshalling module receives a similar amount of optical power of any given one of the plurality of laser beams within a factor of five.

15. The laser module as recited in claim 1, further comprising:
an optical amplifying module configured to amplify laser light received from each of the plurality of optical output ports of the optical marshalling module, the optical amplifying module configured to provide amplified laser light for each of the plurality of optical output ports of the optical marshalling module to a corresponding plurality of optical output ports of the optical amplifying module.

16. The laser module as recited in claim 15, wherein the optical amplifying module and the optical marshalling module are physically separate components.

17. The laser module as recited in claim 16, wherein the optical marshalling module is aligned with the optical amplifying module to direct laser light from the plurality of optical output ports of the optical marshalling module into a respective plurality of optical input ports of the optical amplifying module.

18. The laser module as recited in claim 17, wherein the optical amplifying module is positioned spaced apart from the optical marshalling module.

19. The laser module as recited in claim 17, wherein the optical amplifying module is positioned in contact with the optical marshalling module.

20. The laser module as recited in claim 17, wherein a portion of the optical amplifying module is positioned to overlap a portion of the optical marshalling module.

21. The laser module as recited in claim 17, further comprising:
an optical waveguide positioned between the optical marshalling module and the optical amplifying module, the optical waveguide configured to direct laser light from the plurality of optical output ports of the optical marshalling module into respective ones of the plurality of optical input ports of the optical amplifying module.

22. The laser module as recited in claim 21, wherein the optical waveguide is configured to maintain a polarization of the laser light between the optical marshalling module and the optical amplifying module.

23. The laser module as recited in claim 17, wherein the optical amplifying module is configured to maintain a polarization of laser light between the plurality of optical input ports of the optical amplifying module and the plurality of optical output ports of the optical amplifying module.

24. The laser module as recited in claim 15, wherein both the optical marshalling module and the optical amplifying module are implemented together within a planar lightwave circuit.

25. The laser module as recited in claim 15, wherein the plurality of lasers and the optical marshalling module and the optical amplifying module are implemented together within a planar lightwave circuit.

* * * * *